(12) United States Patent
Lee et al.

(10) Patent No.: US 12,288,734 B2
(45) Date of Patent: Apr. 29, 2025

(54) SEMICONDUCTOR DEVICE

(71) Applicant: SAMSUNG ELECTRONICS CO., LTD., Suwon-si (KR)

(72) Inventors: Juik Lee, Anyang-si (KR); Jong-Min Lee, Hwaseong-si (KR); Jimin Choi, Seoul (KR); Yeonjin Lee, Suwon-si (KR); Jeon Il Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 326 days.

(21) Appl. No.: 17/714,202

(22) Filed: Apr. 6, 2022

(65) Prior Publication Data
US 2023/0030117 A1   Feb. 2, 2023

(30) Foreign Application Priority Data

Jul. 28, 2021   (KR) .................. 10-2021-0099301

(51) Int. Cl.
| | |
|---|---|
| H01L 21/00 | (2006.01) |
| H01L 23/00 | (2006.01) |
| H01L 23/48 | (2006.01) |
| H01L 23/522 | (2006.01) |
| H01L 23/528 | (2006.01) |
| H01L 25/065 | (2023.01) |
| H01L 25/10 | (2006.01) |

(52) U.S. Cl.
CPC ........ *H01L 23/481* (2013.01); *H01L 23/5226* (2013.01); *H01L 23/528* (2013.01); *H01L 24/16* (2013.01); *H01L 24/17* (2013.01); *H01L 25/0657* (2013.01); *H01L 25/105* (2013.01); *H01L 2224/16146* (2013.01); *H01L 2224/17181* (2013.01); *H01L 2225/06513* (2013.01); *H01L 2225/06541* (2013.01)

(58) Field of Classification Search
CPC .. H01L 23/481; H01L 23/5226; H01L 23/528
See application file for complete search history.

(56) References Cited

U.S. PATENT DOCUMENTS

| | | |
|---|---|---|
| 7,732,926 B2 | 6/2010 | Uchiyama |
| 8,058,708 B2 | 11/2011 | Maebashi |
| 10,566,289 B2 * | 2/2020 | Lee .......................... H01L 21/56 |

(Continued)

FOREIGN PATENT DOCUMENTS

| | | | | |
|---|---|---|---|---|
| CN | 115692347 A | * | 2/2023 | ....... H01L 21/76898 |
| KR | 10-2010-0134777 A | | 12/2010 | |

(Continued)

OTHER PUBLICATIONS

Taiwanese Office Action dated Jun. 6, 2023 for corresponding application No. TW 111127373.

*Primary Examiner* — Laura M Menz
(74) *Attorney, Agent, or Firm* — Muir Patent Law, PLLC

(57) ABSTRACT

A semiconductor device includes a substrate including a first side and a second side opposite to each other, a first penetrating structure that penetrates the substrate, and a second penetrating structure that penetrates the substrate, the second penetrating structure being spaced apart from the first penetrating structure, and an area of the first penetrating structure being more than twice an area of the second penetrating structure, as viewed from the first side of the substrate.

19 Claims, 19 Drawing Sheets

(56) References Cited

U.S. PATENT DOCUMENTS

| | | | |
|---|---|---|---|
| 11,482,602 B2* | 10/2022 | Song | H01L 21/823871 |
| 11,626,367 B2* | 4/2023 | Kang | H01L 23/49827 |
| | | | 257/774 |
| 2007/0298584 A1* | 12/2007 | Tokuichi | H01L 21/76229 |
| | | | 257/E21.548 |
| 2008/0048319 A1* | 2/2008 | Ahn | H01L 24/05 |
| | | | 257/737 |
| 2009/0134459 A1 | 5/2009 | Goto et al. | |
| 2013/0009305 A1 | 1/2013 | Oshida | |
| 2015/0097273 A1 | 4/2015 | Farooq et al. | |
| 2017/0125364 A1 | 5/2017 | Cho et al. | |
| 2021/0020543 A1* | 1/2021 | Lee | H01L 24/17 |
| 2021/0305190 A1* | 9/2021 | Choi | H01L 23/562 |
| 2022/0140099 A1* | 5/2022 | Kim | H10B 10/12 |
| | | | 257/329 |
| 2023/0011088 A1* | 1/2023 | Lee | H01L 21/76885 |
| 2023/0030117 A1* | 2/2023 | Lee | H01L 24/17 |
| 2023/0077803 A1* | 3/2023 | Choi | H01L 25/0657 |
| | | | 257/774 |
| 2023/0116911 A1* | 4/2023 | Lee | H01L 23/53228 |
| | | | 257/621 |
| 2024/0071895 A1* | 2/2024 | Kyung | H01L 24/16 |
| 2024/0194521 A1* | 6/2024 | Park | H01L 21/0337 |
| 2024/0194704 A1* | 6/2024 | Lee | H01L 27/14645 |
| 2024/0276703 A1* | 8/2024 | Lee | H10B 12/315 |
| 2024/0282753 A1* | 8/2024 | Kim | H01L 24/08 |

FOREIGN PATENT DOCUMENTS

| | | | | |
|---|---|---|---|---|
| KR | 10-2012-0034518 A | | 4/2012 | |
| KR | 10-2012-0059798 A | | 6/2012 | |
| KR | 10-2015-0057140 A | | 5/2015 | |
| TW | 202306038 A | * | 2/2023 | H01L 21/76898 |

* cited by examiner

SEMICONDUCTOR DEVICE

CROSS-REFERENCE TO RELATED APPLICATION

This application claims priority to Korean Patent Application No. 10-2021-0099301, filed on Jul. 28, 2021, and all the benefits accruing therefrom under 35 U.S.C. § 119, the disclosure of which is incorporated herein by reference in its entirety.

BACKGROUND

1 Field

The present disclosure relates to a semiconductor device.

2. Description of the Related Art

As development of a 3D (three-dimensional) package, in which a plurality of semiconductor chips are mounted inside a single semiconductor package, increases, a technique of forming a TSV (Through Silicon Via) structure that penetrates a substrate or a die and vertically forms electrical connections becomes very important. A formation technique of a stable TSV structure is required to improve the performance and reliability of the 3D packages.

SUMMARY

According to an aspect of the present disclosure, there is provided a semiconductor device including a substrate which includes a first side and a second side that are opposite to each other; a first penetrating structure which penetrates the substrate; and a second penetrating structure which is spaced apart from the first penetrating structure and penetrates the substrate, wherein an area of the first penetrating structure is more than twice an area of the second penetrating structure, on the first side of the substrate.

According to another aspect of the present disclosure, there is provided a semiconductor device including a substrate which includes a first side and a second side that are opposite to each other; a first through via structure which includes a first-1 penetrating part penetrating the substrate, a first-2 penetrating part which is spaced apart from the first-1 penetrating part in a first direction and penetrates the substrate, and a first connecting part which penetrates a part of the substrate from the first side of the substrate and connects the first-1 penetrating part and the first-2 penetrating part; an interlayer insulating film which is disposed on the first side of the substrate and includes a semiconductor element; a wiring structure disposed on the interlayer insulating film; and a connecting terminal which is electrically connected to the wiring structure.

According to still another aspect of the present disclosure, there is provided a semiconductor device including a substrate; a first through via structure which penetrates a substrate and has a first maximum width in a first direction; and a second through via structure which penetrates the substrate and has a second maximum width in the first direction, wherein the first through via structure is spaced apart from the second through via structure, the first maximum width is greater than the second maximum width, each of the first through via structure and the second through via structure includes a single core plug that penetrates the substrate, a barrier film that surrounds the single core plug, and a via insulating film that is interposed between the barrier film and the substrate.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
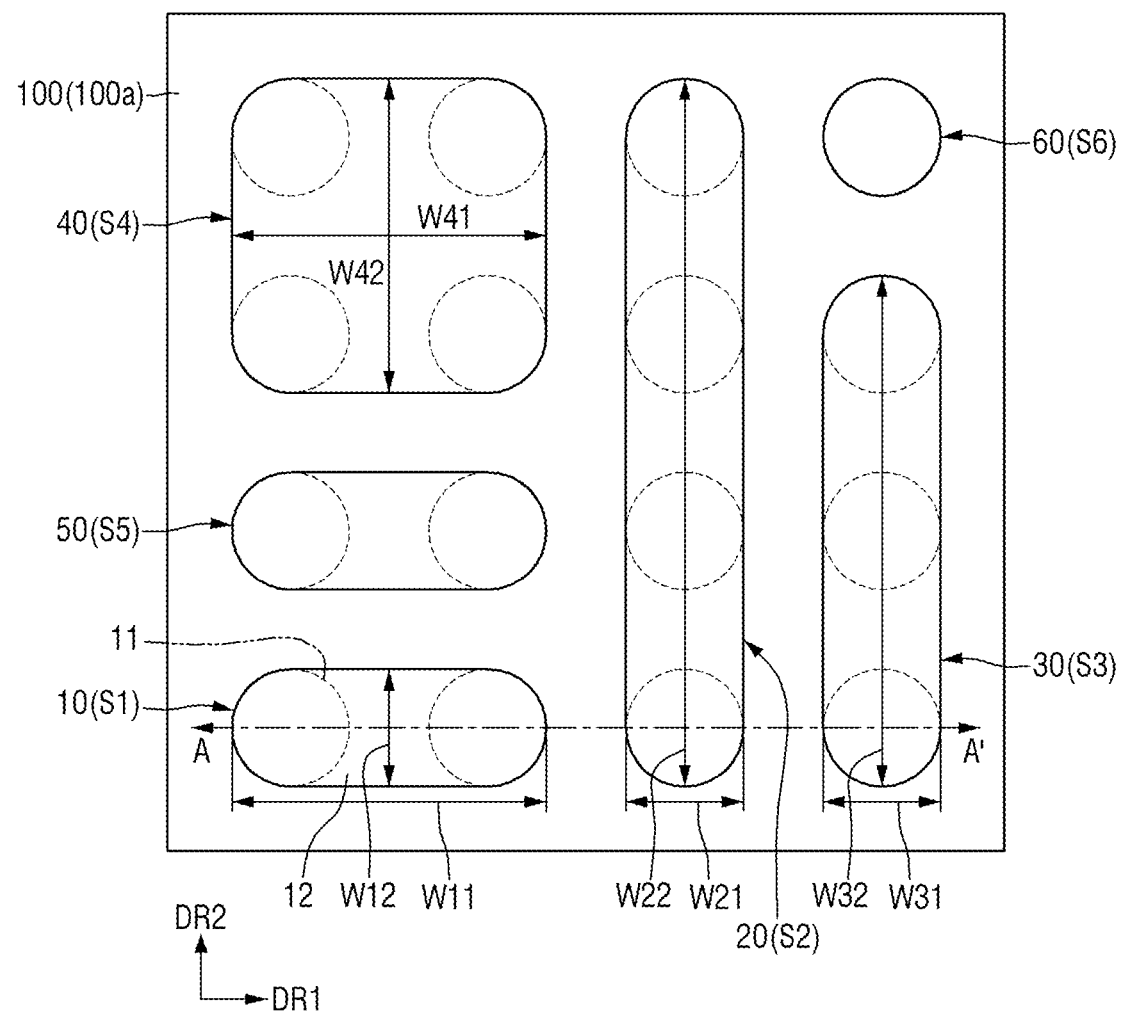
FIG. 1 is a schematic layout diagram of a semiconductor device according to some embodiments.

FIG. 1 is a schematic layout diagram for explaining a semiconductor device according to some embodiments.

Referring to FIG. 1, a semiconductor device according to some embodiments may include a substrate 100 and a plurality of through via structures, e.g., first to sixth through via structures 10 to 60.

The substrate 100 may be a semiconductor wafer. In at least one embodiment, the substrate 100 includes Si. In some other embodiments, the substrate 100 may include a semiconductor element, e.g., Ge (germanium), or a compound semiconductor, e.g., SiC (silicon carbide), GaAs (gallium arsenide), InAs (indium arsenide), and InP (indium phosphide). In at least one embodiment, the substrate 100 may have a silicon on insulator (SOI) structure. For example, the substrate 100 may include a BOX layer (buried oxide layer).

In some embodiments, the substrate 100 may include a conductive region, e.g., an impurity-doped well or an impurity-doped structure. Further, the substrate 100 may have various element separation structures, e.g., a shallow trench isolation (STI) structure.

The plurality of through via structures 10 to 60 may penetrate the substrate 100. At least one of the plurality of through via structures 10 to 60 may include penetrating parts 11 arranged, e.g., to be spaced apart from each other, in a first direction DR1 and a second direction DR2, and a connecting part 12 that connects, e.g., some of, the penetrating parts 11 adjacent to each other. For example, as illustrated in FIG. 1, the connecting part 12 may be directly, e.g., and integrally, connected to the penetrating parts 11 (e.g., an area between facing dashed lines in FIG. 1) to connect therebetween. The first and second directions DR1 and DR2 may be intersecting directions, e.g., perpendicular or orthogonal to each other.

For example, the penetrating parts 11 may be arranged in the first direction DR1 and/or the second direction DR2, e.g., the penetrating parts 11 may be spaced apart from each other in the first direction DR1 and/or the second direction DR2 in a matrix pattern. For example, as viewed in a plan view, each penetrating part 11 may have, e.g., a circular shape, on a first side 100a of the substrate 100. A maximum width of the penetrating part 11 in the first direction DR1, e.g., a diameter of a single penetrating part 11 in the first direction DR1, may be equal to the maximum width of the penetrating part 11 in the second direction DR2, i.e., a diameter of the single penetrating part 11 in the second direction DR2.

For example, the first through via structure 10 and the fifth through via structure 50 may include penetrating parts 11 arranged in the first direction DR1, and a connecting part 12 that connect the penetrating parts 11 adjacent to each other. For example, as illustrated in FIG. 1, each of the first through via structure 10 and the fifth through via structure 50 may include two penetrating parts 11 adjacent to each other in the first direction DR1, and a connecting part 12 that connects the two adjacent penetrating parts 11 to each other. A maximum width W11 of the first through via structure 10 in the first direction DR1, i.e., a width in the first direction DR1 of the entire first through via structure 10 between facing sidewalls, may be greater than a maximum width W12 of the first through via structure 10 in the second direction DR2, i.e., a width in the second direction DR2 of the entire first through via structure 10 between facing sidewalls. A maximum width of the fifth through via structure 50 in the first direction DR1 may also be greater than a maximum width of the fifth through via structure 50 in the second direction DR2. For example, as illustrated in FIG. 1, the first through via structure 10 and the fifth through via structure 50 may have a same number of penetrating parts and same dimensions. Hereinafter, the penetrating parts 11 and the connecting part 12 will be described in detail referring to FIG. 1.

The second through via structure 20 and the third through via structure 30 may include penetrating parts 11 arranged, e.g., to be spaced apart from each other, in the second direction DR2, and a connecting part 12 that connects the penetrating parts 11 adjacent to each other. Each of the maximum widths W21 and W31 of the second and third through via structures 20 and 30 in the first direction DR1 may be smaller than each of the maximum widths W22 and W32 of the second and third through via structures 20 and 30 in the second direction DR2. For example, as illustrated in FIG. 1, the maximum width W22 of the second through via structure 20 may be larger than the maximum width W32 of the third through via structure 30, e.g., the second and third through via structures 20 and 30 may include four and three penetrating parts, respectively.

The fourth through via structure 40 may include a plurality of penetrating parts 11 arranged in the first direction DR1 and the second direction DR2, and a connecting part 12 that connects between the penetrating parts 11 adjacent to each other. The connecting part 12 may fill the space between the penetrating parts 11 arranged in two rows and two columns. A maximum width W41 of the fourth through via structure 40 in the first direction DR1 may be equal to a maximum width W42 in the second direction DR2. The present disclosure is not limited thereto, and the connecting part 12 may connect the penetrating parts 11 arranged in N rows and M columns (N and M are natural numbers), and may fill the space between the penetrating parts 11.

The sixth through via structure 60 may include a single penetrating part. The single penetrating part of the sixth through via structure 60 may have a same diameter as the penetrating parts 11 of the first through fifth through via structures 10 to 50. As used herein, the term "same" means substantially the same level that may be accepted by engineers in the same field, and includes minute errors that may be accepted by engineers in the same field.

Therefore, the plurality of through via structures 10 to 60 may include through via structures having different widths from each other and through via structures having the same width as each other in the first direction DR1, on the first side 100a of the substrate 100, i.e., as viewed in a top view (from the first side 100a). The maximum width of any one of the plurality of through via structures 10 to 60 may be more than twice the maximum width of the other thereof.

For example, the maximum width W21 of the second through via structure 20 in the first direction DR1 may be smaller than the maximum width W11 of the first through via structure 10 and may be the same as the maximum width W31 of the third through via structure 30. A maximum width W32 of the third through via structure 30 in the second direction DR2 may be greater than the maximum width W11 of the first through via structure 10 and smaller than the maximum width W22 of the second through via structure 20. In the first direction DR1, the maximum width W11 of the first through via structure 10 may be more than twice the maximum width W21 of the second through via structure 20.

Further, the plurality of through via structures 10 to 60 may include through via structures having different areas from each other and through via structures having the same area, on the first side 100a of the substrate 100, i.e., as viewed in a plan view (e.g., in a top view from the first side 100a). In the present specification, the area means a horizontal cross-sectional area in a plane including the first direction DR1 and the second direction DR2, e.g., the area of a through via structure refers to a horizontal cross-sectional area through a plane including the first direction DR1 and the second direction DR2 (as viewed in FIG. 1).

For example, as illustrated in FIG. 1, an area S1 of the first through via structure 10 on the first side 100a of the substrate 100 may be different from each of an area S2 of the second through via structure 20, an area S3 of the third through via structure 30, an area S4 of the fourth through via structure 40, and an area S6 of the sixth through via structure 60 (as viewed in a top view from the first side 100a). As further illustrated in FIG. 1, the area S1 of the first through via structure 10 on the first side 100a of the substrate 100 may be the same as an area S5 of the fifth through via structure 50 (as viewed in a top view from the first side 100a). The area S1 of the first through via structure 10 on the first side 100a of the substrate 100 may be smaller than the area S2 of the second through via structure 20, or may be greater than the area S6 of the sixth through via structure 60 (as viewed in a top view from the first side 100a).

Since the first to sixth through via structures 10 to 60 include the penetrating parts 11 and the connecting part 12 that connects the penetrating parts 11 adjacent to each other, an area of one of the plurality of through via structures 10 to 60 on the first side 100a of the substrate 100 may be more than twice the area of the other thereof. For example, at least one of the first to sixth through via structures 10 to 60 may have an area that is more than twice an area of another one of the first to sixth through via structures 10 to 60. For example, since each of the via structures 10 to 50 includes a plurality of penetrating parts 11 and a space therebetween, an area of one of the plurality of through via structures 10 to 60 on the first side 100*a* of the substrate 100 may be more than twice an area of the other thereof. For example, the area S2 of the second through via structure 20 (e.g., including four penetrating parts 11 and the connecting part 12 therebetween) may be more than twice the area S6 of the sixth through via structure 60 (e.g., including a single penetrating part 11) and may be more than twice the area S1 of the first through via structure 10 (e.g., including two penetrating parts 11 and the connecting part 12 therebetween).

Figure 2:
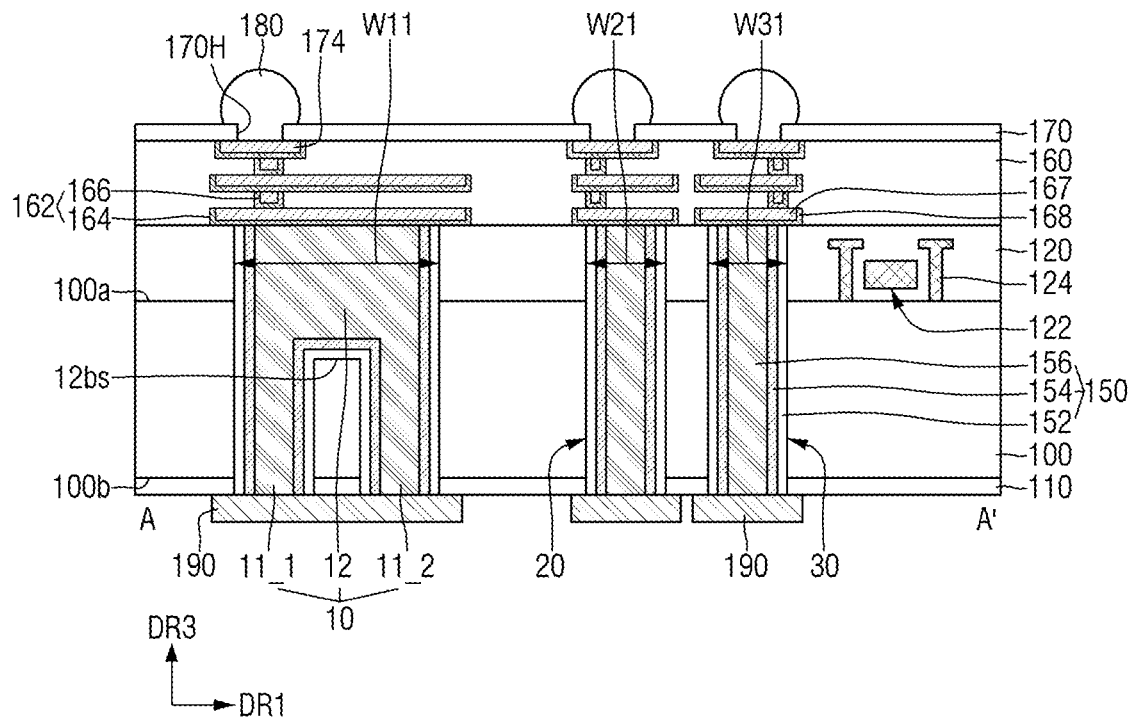
FIG. 2 is a cross-sectional view taken along line A-A' of FIG. 1.

FIG. 2 is a cross-sectional view taken along line A-A' of FIG. 1.

Referring to FIGS. 1 and 2, a semiconductor device according to some embodiments may include the substrate 100, a first passivation film 110, an interlayer insulating film 120, a through via structure 150, an inter-wiring insulating film 160, a second passivation film 170, and a connecting terminal 180.

The substrate 100 may include the first side 100*a* and a second side 100*b* that are opposite to each other. The first side 100*a* and the second side 100*b* are opposite to each other in the third direction DR3, the first side 100*a* may be an upper side of the substrate 100, and the second side 100*b* may be a lower side of the substrate 100 on the basis of the third direction DR3.

The first passivation film 110 may be disposed on the second side 100*b* of the substrate 100. A first connecting pad 190 may be disposed on the first passivation film 110. The first passivation film 110 may include, e.g., a silicon oxide film, a silicon nitride film, a polymer, or a combination thereof.

The interlayer insulating film 120 may be disposed on the first side 100*a* of the substrate 100, e.g., the substrate 100 may be between the interlayer insulating film 120 and the first passivation film 110 in the third direction DR3. The interlayer insulating film 120 may surround a plurality of semiconductor elements 122 and a connecting structure 124 formed on the first side 100*a* of the substrate 100.

The interlayer insulating film 120 may include, e.g., a silicon oxide, a silicon nitride, a silicon oxynitride, or a low-dielectric material having a dielectric constant lower than that of the silicon oxide. The low-dielectric material included in the interlayer insulating film 120 is a material having a dielectric constant lower than that of silicon oxide, and may be advantageous in realizing high integration and high speed of a semiconductor device by improved insulation capability.

The plurality of semiconductor elements 122 may be electrically connected to the connecting structure 124 and may be electrically separated by the interlayer insulating film 120. The interlayer insulating film 120, the plurality of semiconductor elements 122, and the connecting structure 124 may be formed by a FEOL (Front-end-of-Line) process.

The plurality of semiconductor elements 122 may be memory elements or logic elements. The memory element may include a volatile or non-volatile memory element. For example, the volatile memory element may include existing volatile memory elements, e.g., a dynamic random access memory (RAM), a static RAM (SRAM) or a thyristor RAM (TRAM), and volatile memory elements that are currently being developed. For example, the non-volatile memory element may include existing non-volatile memory elements, e.g., a flash memory, a MRAM (magnetic RAM), a STT-MRAM (spin-transfer torque MRAM), a FRAM (ferroelectric RAM), a PRAM (phase change RAM) or RRAM (resistive RAM) and non-volatile memory elements which are currently being developed. The logic elements may be implemented as, e.g., a microprocessor, a graphic processor, a signal processor, a network processor, a chipset, an audio codec, a video codec, an application processor, a system-on-chip, and the like.

The plurality of through via structures 10 to 60 may penetrate the substrate 100 and the first passivation film 110. The plurality of through via structures 10 to 60 may penetrate the first passivation film 110 and may be electrically connected to the first connecting pad 190.

Referring to FIGS. 1 and 2, the second and third through via structures 20 and 30 shown on the right side of FIG. 2 correspond to the penetrating parts 11 of the second and third through via structures 20 and 30 on the right side of FIG. 1. The description of the penetrating parts 11 of the second to sixth through via structures 20 to 60 and the connecting part 12 of the second to sixth through via structures 20 to 60 is the same as the description of the penetrating part 11 and the connecting part 12 of the first through via structure 10. Therefore, the first through via structure 10 will be mainly described below.

As illustrated in FIG. 2, the first through via structure 10 may include a first penetrating part 11_1 and a second penetrating part 11_2 that penetrate the substrate 100 and are spaced apart from each other in the first direction DR1. The connecting part 12 of the first through via structure 10 penetrates a part of the substrate 100 and connects the first penetrating part 11_1 and the second penetrating part 11_2. The first and second penetrating parts 11_1 and 11_2 of FIG. 2 correspond to the two circles in the first through via structure 10 of FIG. 1.

In detail, as illustrated in FIG. 2, the first penetrating part 11_1 and the second penetrating part 11_2 may completely penetrate the substrate 100, e.g., an entire thickness of the substrate 100 in the third direction DR3. The first penetrating part 11_1 and the second penetrating part 11_2 may extend from the first side 100*a* of the substrate 100 to the second side 100*b* of the substrate 100. Further, the first penetrating part 11_1 and the second penetrating part 11_2 penetrate the first passivation film 110 and may be electrically connected to the first connecting pad 190, e.g., the first and second penetrating parts 11_1 and 11_2 may directly contact the first connecting pad 190.

As further illustrated in FIG. 2, the connecting part 12 may be spaced apart from the first connecting pad 190 by the substrate 100, e.g., along the third direction DR3, and may not come into contact with the first connecting pad 190. That is, the connecting part 12 may penetrate, e.g., only, a part of the substrate 100. The connecting part 12 may penetrate a part of the substrate 100 from the first side 100*a* of the substrate 100. A bottom side 12*bs* of the connecting part 12 may be disposed inside the substrate 100. The bottom side 12*bs* of the connecting part 12 may be defined by the substrate 100. Alternatively, on the basis of the third direction DR3, the upper parts of the first penetrating part 11_1 and the second penetrating part 11_2 may be connected by the connecting part 12, and the lower parts thereof may be spaced apart from each other by the substrate 100.

In some embodiments, the plurality of through via structures 10 to 60 may penetrate the interlayer insulating film 120. The penetrating part 11 and the connecting part 12 may penetrate the interlayer insulating film 120. That is, the plurality of through via structures 10 to 60 may include a first portion surrounded by the substrate 100, and a second portion surrounded by the interlayer insulating film 120, e.g., each of the substrate 100 and the interlayer insulating film 120 may completely surround a perimeter of each of the plurality of through via structures 10 to 60 in a plan (e.g., top) view.

Each of the plurality of through via structures 10 to 60 may include a via insulating film 152, a barrier film 154, and a core plug 156. The first through via structure 10 will be mainly described hereinafter.

As illustrated in FIG. 2, the core plug 156 may include portions which are spaced apart from each other in the first direction DR1 and completely penetrate the first passivation film 110, the substrate 100, and the interlayer insulating film 120, and a portion that completely penetrates the interlayer insulating film 120 and partially penetrates the substrate 100 from the first side 100*a* of the substrate 100 to connect the penetrating parts. The core plug 156 may be integrally formed without a boundary film inside, e.g., the core plug of the first through via structure 10 having the II-shaped cross-section illustrated in FIG. 2 may be a seamless and integral structure that includes a connecting part 12 that connects two penetrating parts 11.

The barrier film 154 may surround the core plug 156. The via insulating film 152 may surround the barrier film 154. The via insulating film 152 may be disposed between the barrier film 154 and the first passivation film 110, the substrate 100, and the interlayer insulating film 120.

In some embodiments, the width of the core plug 156 may be constant in the first direction DR1 and the second direction DR2. In some embodiments, the width of the core plug 156 in the first direction DR1 and the second direction DR2 may decrease toward the second side 100*b* of the substrate 100. The core plug 156 may include, e.g., at least one of Cu, CuSn, CuMg, CuNi, CuZn, CuPd, CuAu, CuRe, CuW, W, W alloy, Ti, TiN, Ta. and TaN.

The barrier film 154 may surround the core plug 156. The barrier film 154 may include, e.g., at least one of W, WN, WC, Ti, TiN, Ta, TaN, Ru, Co, Mn, WN, Ni, and NiB.

The via insulating film 152 may be interposed between the barrier film 154 and the first passivation film 110, the substrate 100, and the interlayer insulating film 120. For example, the via insulating film 152 may include an insulating material, e.g., an oxide film, a nitride film, a carbonized film, a polymer or a combination thereof.

The inter-wiring insulating film 160 may be disposed on the interlayer insulating film 120. The inter-wiring insulating film 160 may surround the wiring structure 162. The wiring structure 162 may be electrically separated by the inter-wiring insulating film 160. The inter-wiring insulating film 160 may include, e.g., silicon oxide, silicon nitride or a combination thereof.

The wiring structure 162 may include a plurality of wiring layers 164 and a plurality of wiring vias 166. The wiring structure 162 may be electrically connected to each of the plurality of through via structures 10 to 60. The penetrating parts 11 and the connecting parts 12 of the plurality of through via structures 10 to 60 may come into contact with the wiring structure 162.

Each of the plurality of wiring layers 164 and the plurality of wiring vias 166 may include a wiring filling film 167 and a wiring barrier film 168. The wiring barrier film 168 may extend along the bottom side and side walls of the wiring filling film 167. In some embodiments, a protective layer that protects the semiconductor device from external impact or moisture may be further formed on the inter-wiring insulating film 160.

The second passivation film 170 may be disposed on the inter-wiring insulating film 160. The second passivation film 170 may include a hole 170H that exposes a second connecting pad 174 connected to the wiring structure 162. The second passivation film 170 may include, e.g., a silicon oxide film, a silicon nitride film, a polymer, or a combination thereof.

The connecting terminal 180 may be disposed on the second connecting pad 174. The connecting terminal 180 may be electrically connected to the second connecting pad 174. The connecting terminal 180 may be electrically connected to the first to third through via structures 10 to 30 through the second connecting pad 174 and the wiring structure 162. The connecting terminal 180 may include, e.g., a solder layer having a spherical shape or a ball shape. The connecting terminal 180 may include, e.g., tin (Sn), indium (In), bismuth (Bi), antimony (Sb), copper (Cu), silver (Ag), zinc (Zn), lead (Pb), and/or alloys thereof.

The connecting terminal 180 may further include a pillar structure. The pillar structure may include, e.g., nickel (Ni), nickel alloy, copper (Cu), copper alloy, palladium (Pd), platinum (Pt), gold (Au), cobalt (Co) and combinations thereof. Further, the connecting terminal 180 may further include a lower metal layer disposed between the pillar structure and the second connecting pad 174. The lower metal layer may be a seed layer, an adhesive layer, or a barrier layer for forming a pillar structure. For example, the lower metal layer may include chromium (Cr), tungsten (W), titanium (Ti), copper (Cu), nickel (Ni), aluminum (Al), palladium (Pd), gold (Au) or a combination thereof. The lower metal layer may be a single metal layer, but may also be a stacked structure including a plurality of metal layers.

The through via structure may be used to connect a semiconductor chip to another semiconductor chip or to a package substrate. A connection type that uses the through via structure has a smaller physical connection distance between the semiconductor chips or between the semiconductor chip and the package substrate, e.g., as compared to a connection type that uses wire bonding, and therefore, may be advantageous in terms of communication speed, power consumption, and/or miniaturization.

The through via structures are arranged on the substrate at regular intervals. As the semiconductor device becomes smaller, the size of the through via structures also becomes smaller. Therefore, the advantageous characteristics (e.g., communication speed) of the connection type that uses the through via structure could potentially be reduced.

In contrast, according to example embodiments, at least one of the plurality of through via structures 10 to 60 may include penetrating parts 11 arranged at regular intervals inside the substrate 100, and a connecting part 12 that connects adjacent penetrating parts 11 as needed, e.g., to a required through via structure size. Since the semiconductor device according to some embodiments connects the penetrating parts 11 adjacent to each other as needed, the degree of freedom of the design of the semiconductor device may be improved and/or enhanced.

For example, a transmitted signal or data signal may be transmitted through a through via structure having a relatively large area on the first side 100*a* of the substrate 100, and an address signal or command signal may be transmitted through a through via structure having a relatively small area on the first side 100*a* of the substrate 100. This allows particular signals to be transmitted quickly with lower resistance.

Further, the connecting part 12 may connect the penetrating parts 11 adjacent to each other inside the substrate 100. Accordingly, since the penetrating part 11 may be directly connected through the connecting part 12 without additional wiring, the connection efficiency may be improved and/or enhanced, and the power consumption of the semiconductor device may be improved and/or reduced. In addition, the size of the semiconductor device may also be reduced.

FIGS. 3 to 6 are cross-sectional views taken along line A-A' of FIG. 1. For convenience of explanation, only differences relative to FIGS. 1 and 2 will be mainly described.

Figure 3:
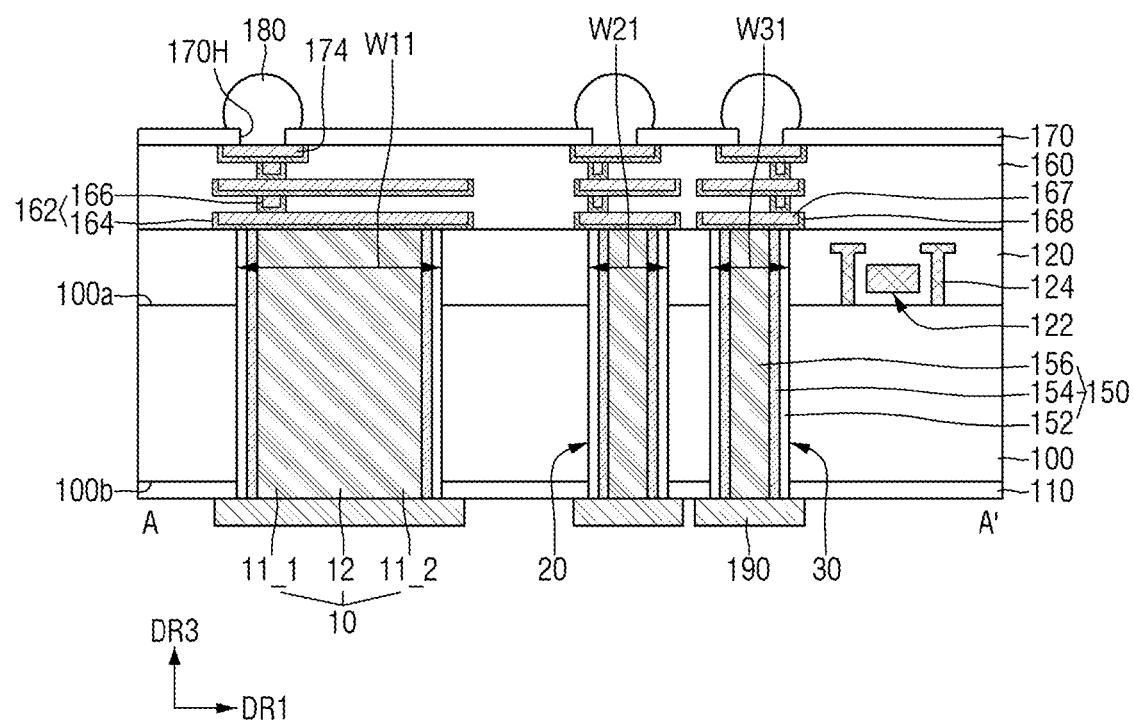
FIGS. 3 to 6 are cross-sectional views taken along line A-A' of FIG. 1.

Referring to FIGS. 1 and 3, in the semiconductor device according to some embodiments, a plurality of through via structures 10 to 50 may completely penetrate the substrate 100. The connecting parts 12 of the plurality of through via structures 10 to 50 may completely penetrate the substrate 100. The connecting parts 12 may extend from the first side 100a of the substrate 100 to the second side 100b. The connecting parts 12 may penetrate the first passivation film 110 and may be electrically connected to the first connecting pad 190. The penetrating part 11 and the connecting part 12 may come into contact with the first connecting pad 190.

Figure 4:
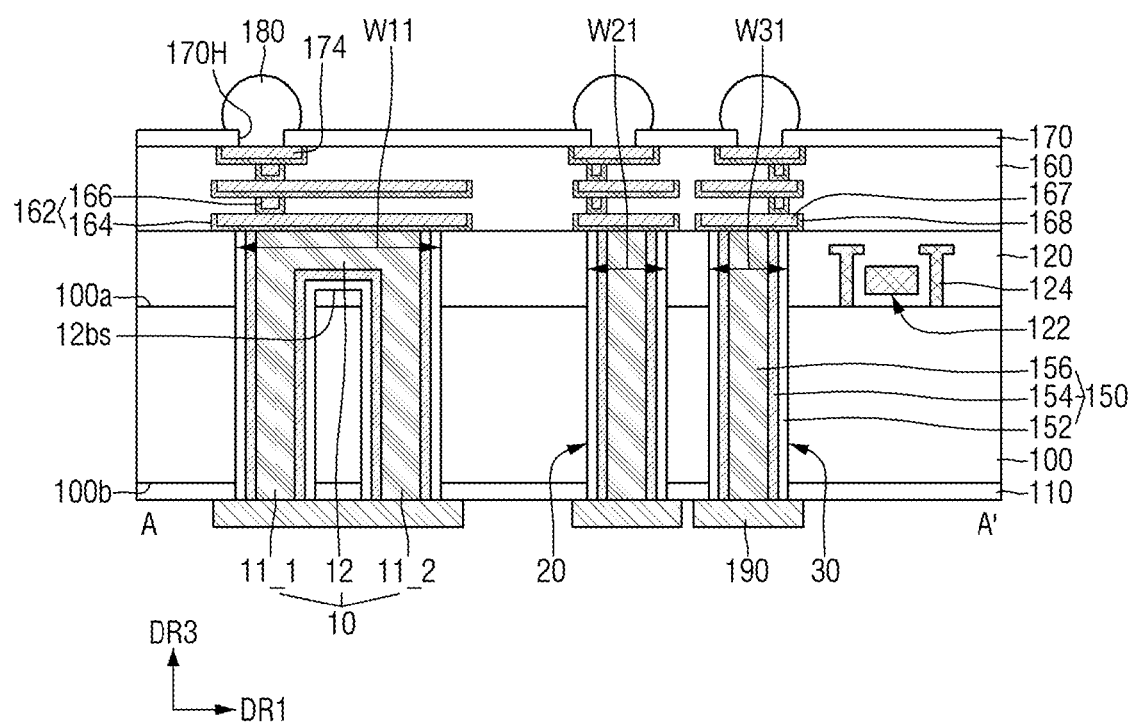

Referring to FIGS. 1 and 4, in the semiconductor device according to some embodiments, the bottom side 12bs of the connecting part 12 of the plurality of through via structures 10 to 50 may be disposed inside the interlayer insulating film 120. The bottom side 12bs of the connecting part 12 may be defined by the interlayer insulating film 120. That is to say, on the basis of the third direction DR3, the upper parts of the first penetrating part 11_1 and the second penetrating part 11_2 may be connected by the connecting part 12, and the lower parts thereof may be spaced apart from each other by the interlayer insulating film 120 and the substrate 100. In this case, the connecting part 12 of FIG. 1 corresponds to a portion in which the connecting part 12 of FIG. 4 overlaps the first side 100a of the substrate 100.

The core plug 156 may completely penetrate the first passivation film 110, the substrate 100, and the interlayer insulating film 120. The core plug 156 may be integrally formed inside as a single structure without a boundary film. The barrier film 154 may surround the core plug 156. The via insulating film 152 may surround the barrier film 154. The via insulating film 152 may be disposed between the barrier film 154 and the first passivation film 110, the substrate 100, and the interlayer insulating film 120.

Figure 5:
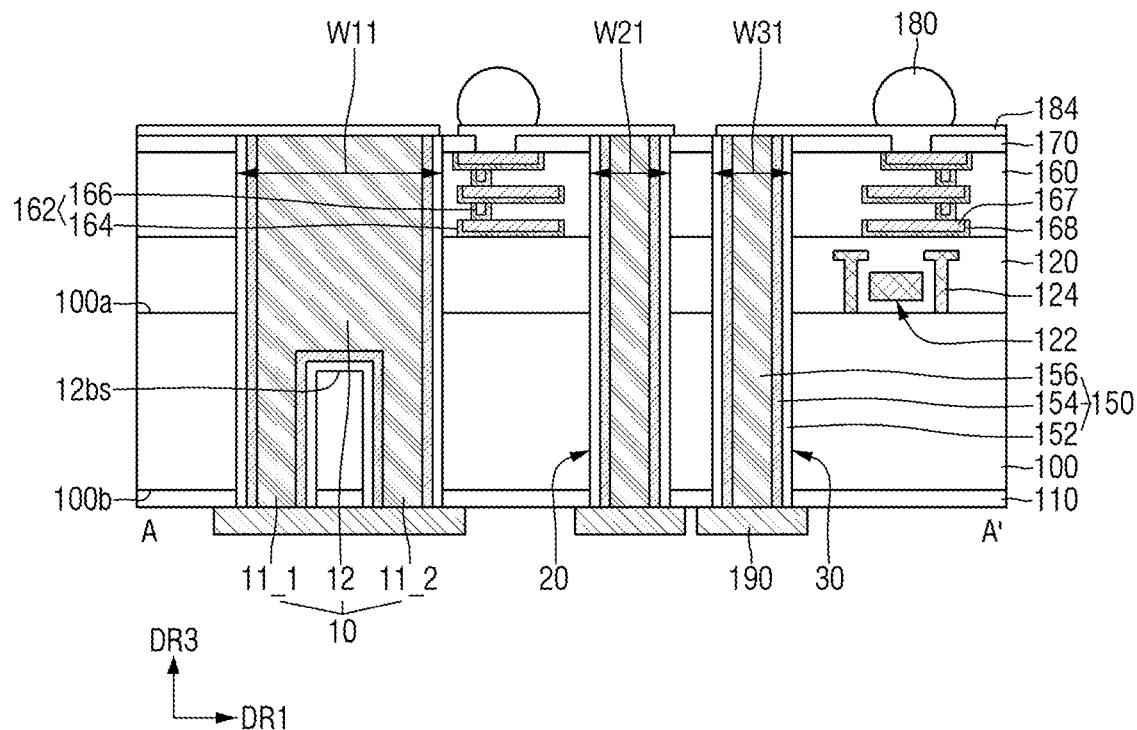

Referring to FIGS. 1 and 5, in the semiconductor device according to some embodiments, the plurality of through via structures 10 to 60 may be formed after formation of the interlayer insulating film 120 that covers the plurality of semiconductor elements 122 and the connecting structure 124, and the inter-wiring insulating film 160 that surrounds the wiring structure 162. Accordingly, the plurality of through via structures 10 to 60 may further penetrate the inter-wiring insulating film 160. The penetrating part 11 and the connecting part 12 may penetrate the inter-wiring insulating film 160. That is, the plurality of through via structures 10 to 60 may include a portion surrounded by the substrate 100, a portion surrounded by the interlayer insulating film 120, and a portion surrounded by the inter-wiring insulating film 160.

In some embodiments, the bottom side 12bs of the connecting part 12 may be disposed inside the substrate 100. Alternatively, in some embodiments, the bottom side 12bs of the connecting part 12 may be disposed inside the interlayer insulating film 120 or the inter-wiring insulating film 160. Alternatively, in some embodiments, the bottom side 12bs of the connecting part 12 may be disposed on the first side 100a of the substrate 100 or a side on which the interlayer insulating film 120 and the inter-wiring insulating film 160 are in contact with each other.

An upper wiring 184 may be further formed on the second passivation film 170. The upper wiring 184 may be disposed between, e.g., each of, the plurality of through via structures 10 to 60 and the connecting terminal 180. The plurality of through via structures 10 to 60 penetrate the second passivation film 170 and may be electrically connected to the upper wiring 184, and may be electrically connected to the connecting terminal 180 through the upper wiring 184. The penetrating part 11 and the connecting part 12 may come into contact with the upper wiring 184.

Figure 6:
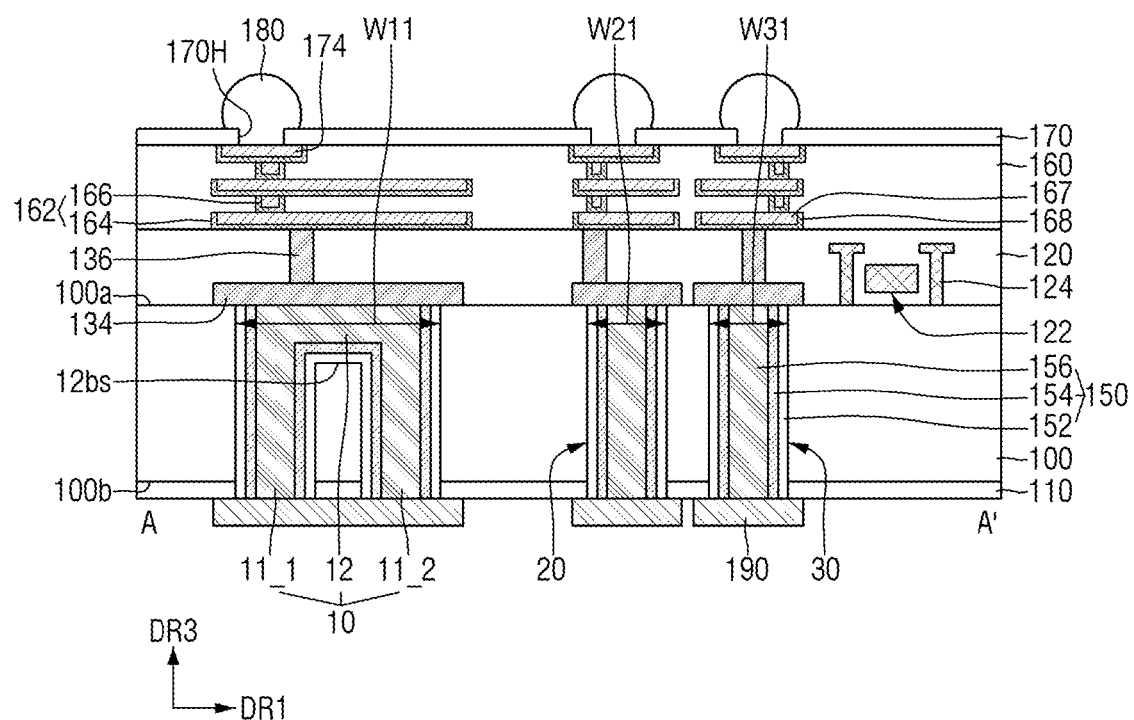

Referring to FIGS. 1 and 6, in the semiconductor device according to some embodiments, a plurality of through via structures 10 to 60 may penetrate the substrate 100. The penetrating part 11 may extend from the first side 100a of the substrate 100 to the second side 100b. The connecting part 12 may penetrate a part of the substrate 100 from the first side 100a of the substrate 100 to connect the penetrating parts 11 adjacent to each other.

After the plurality of through via structures 10 to 60 are formed, the interlayer insulating film 120 that covers the plurality of semiconductor elements 122 and the connecting structure 124, and the inter-wiring insulating film 160 that surrounds the wiring structure 162 may be formed on the substrate 100 and the plurality of through via structures 10 to 60. The plurality of through via structures 10 to 60 may be electrically connected to the wiring structure 162 through the connecting wiring layers 134 and 136. The penetrating part 11 and the connecting part 12 may come into contact with the connecting wiring layers 134 and 136.

Figure 7:
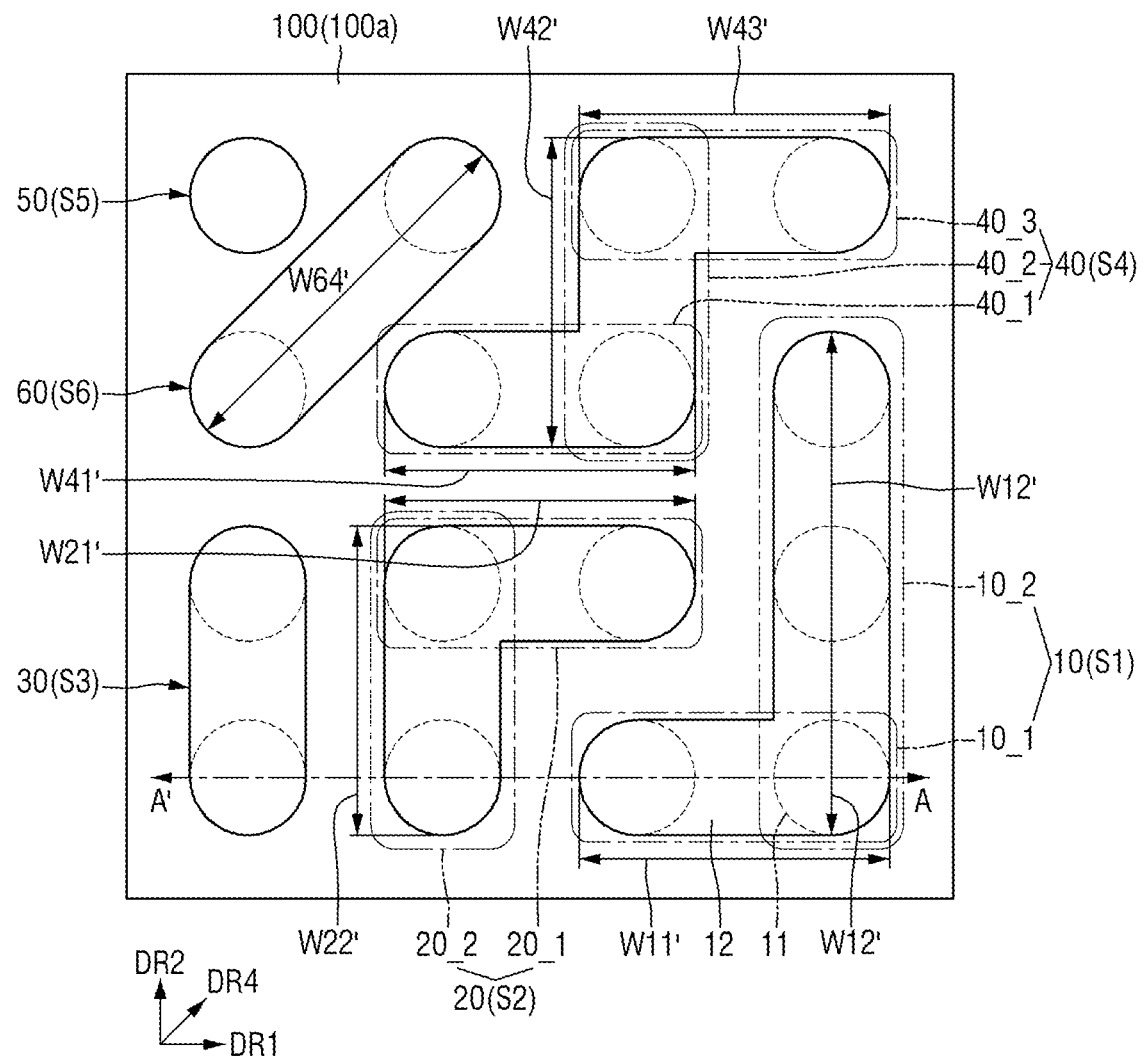
FIG. 7 is a schematic layout diagram of a semiconductor device according to some embodiments.

FIG. 7 is a schematic layout diagram of a semiconductor device according to some embodiments. For convenience of explanation, only differences relative to FIGS. 1 and 2 will be mainly described. For reference, a cross-sectional view taken along line A-A' of FIG. 7 may be any one of FIGS. 2 to 6.

Referring to FIG. 7, in the semiconductor device according to some embodiments, the connecting part 12 may connect the penetrating parts 11 adjacent to each other in the first direction DR1, the second direction DR2, or the fourth direction DR4. For example, at least one of the through via structures may extend in both the first and second directions DR1 and DR2, and at least one of the through via structures may extend in the fourth direction DR4, e.g., the fourth direction DR4 may extend diagonally with respect to the first and second directions DR1 and DR2.

For example, the first through via structure 10 may include a first extension part 10_1 extending in the first direction DR1, and a second extension part 10_2 extending from the first extension part 10_1 in the second direction DR2. The first extension part 10_1 may include penetrating parts 11 arranged in the first direction DR1, and a connecting part 12 that connects the penetrating parts 11 in the first direction DR1. The second extension part 10_2 may include penetrating parts 11 arranged in the second direction DR2, and a connecting part 12 that connects the penetrating parts 11 in the second direction DR2. The second extension part 10_2 may extend from the penetrating part 11 of the first extension part 10_1 in the second direction DR2, e.g., a same penetrating part 11 may be in a corner of the first through via structure 10 to be part of each of the first and second extension parts 10_1 and 10_2. For example, although the second extension part 10_2 may extend from the penetrating part 11 disposed at the end of the first extension part 10_1 in the second direction DR2, the embodiment is not limited thereto. For example, a maximum width W11' of the first extension part 10_1 in the first direction DR1 may be smaller than a maximum width W12' of the second extension part 10_2 in the second direction DR2.

The second through via structure 20 may include a first extension part 20_1 extending in the first direction DR1, and a second extension part 20_2 extending from the first extension part 20_1 in the second direction DR2. For example, a maximum width W21' of the first extension part 20_1 in the first direction DR1 may be the same as a maximum width W22' of the second extension part 20_2 in the second direction DR2.

The fourth through via structure 40 may include a first extension part 40_1 extending in the first direction DR1, a second extension part 40_2 extending from the first extension part 40_1 in the second direction DR2, and a third extension part 40_3 extending from the second extension part 40_2 in the first direction DR1. For example, the second extension part 40_2 may extend from the end of the first extension part 40_1 in the second direction DR2, and the third extension part 40_3 may extend from the end of the second extension part 40_2 that is not connected to the first extension part 40_1 in the first direction DR1. For example, a maximum width W41' of the first extension part 40_1 in the first direction DR1 may be the same as a maximum width W42' of the second extension part 40_2 in the second direction DR2 and a maximum width W43' of the third extension part 40_3 in the first direction DR1.

A sixth through via structure 60 may extend in the fourth direction DR4. The fourth direction DR4 may be a diagonal direction between the first direction DR1 and the second direction DR2. The sixth through via structure 60 may include penetrating parts 11 arranged in the fourth direction DR4, and a connecting part 12 that connects the penetrating parts 11. The semiconductor device may further include a through via structure having a width in the fourth direction DR4 that is greater than the maximum width W64' of the sixth through via structure 60 in the fourth direction DR4.

In the semiconductor device according to some embodiments, the connecting part 12 may connect the penetrating parts 11 adjoining in the first direction DR1, the second direction DR2, or the fourth direction DR4, among the penetrating parts 11 that are arranged in the first direction DR1 and the second direction DR2, if necessary. Therefore, the forms of the through via structures 10 to 60 may be various on the first side 100*a* of the substrate 100, and the areas S1 to S6 may also be the same or different.

FIGS. 8 to 19 are stages in a fabricating method according to some embodiments.

Figure 8:
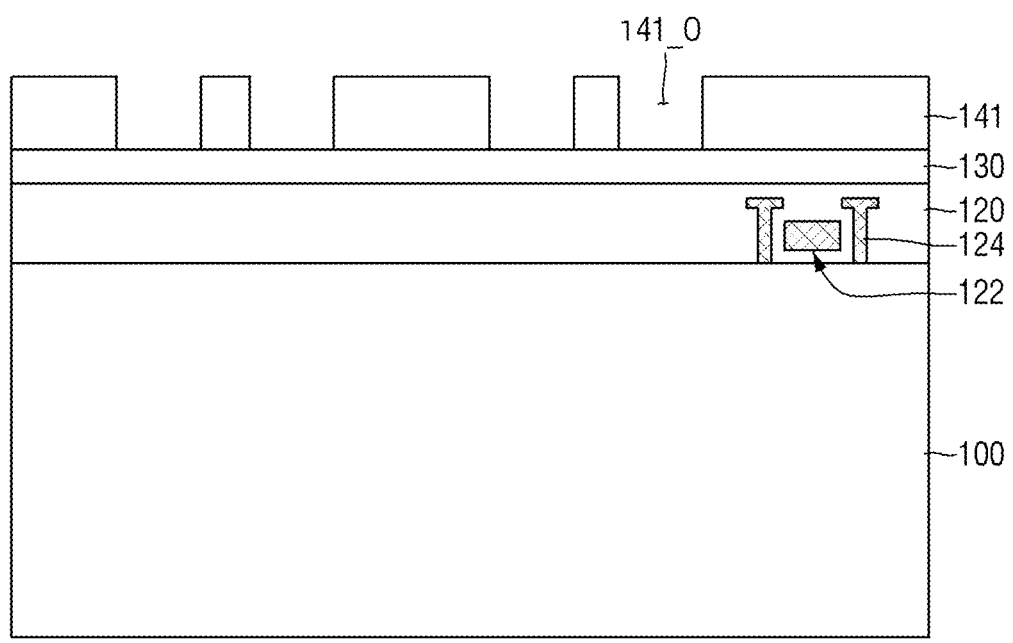
FIGS. 8 to 19 are stages in a method for fabricating a semiconductor device according to some embodiments.

Referring to FIG. 8, after the interlayer insulating film 120 that covers the plurality of semiconductor elements 122 and the connecting structure 124 is formed on the substrate 100, an etching stop film 130 and a first mask pattern 141 may be formed on the interlayer insulating film 120. The first mask pattern 141 may include a first opening 141_O that exposes a part of the upper side of the etching stop film 130. The first opening 141_O may be formed at a position corresponding to the penetrating part 11 of the through via structure (150 of FIG. 2) to be formed later.

The etching stop film 130 may be formed of, e.g., a silicon nitride film or a silicon oxynitride film. The first mask pattern 141 may be formed of, e.g., a photoresist film.

Figure 9:
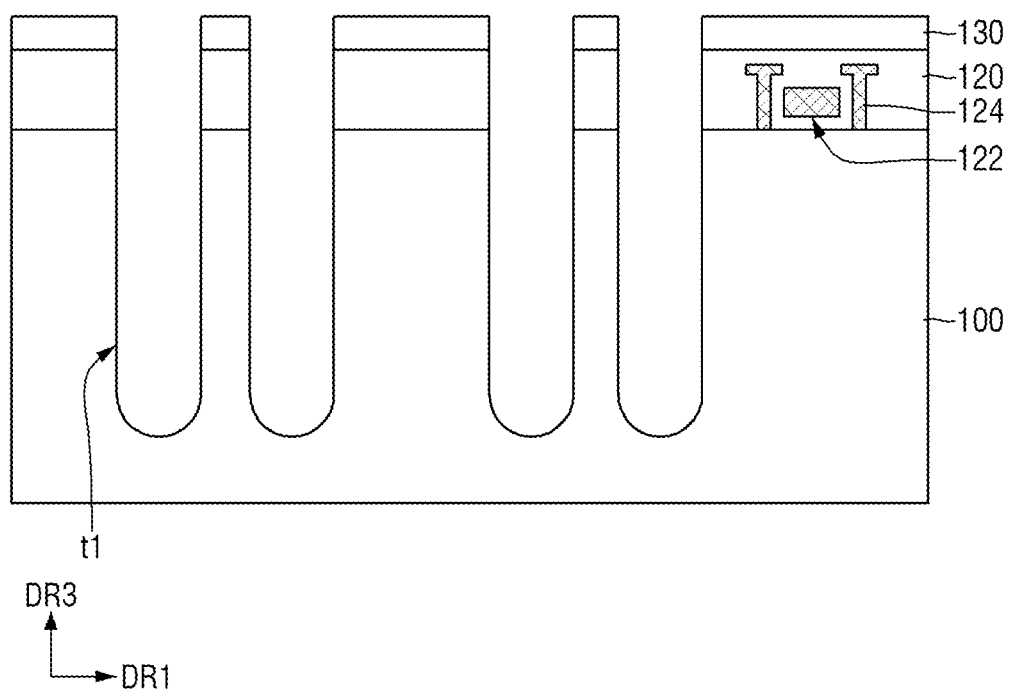

Referring to FIG. 9, the etching stop film 130, the interlayer insulating film 120, and the substrate 100 may be etched by utilizing the first mask pattern (141 of FIG. 8) as an etching mask to form a first via hole t1. Subsequently, the first mask pattern (141 of FIG. 8) may be removed to expose the upper side, i.e., upper surface, of the etching stop film 130.

Figure 10:
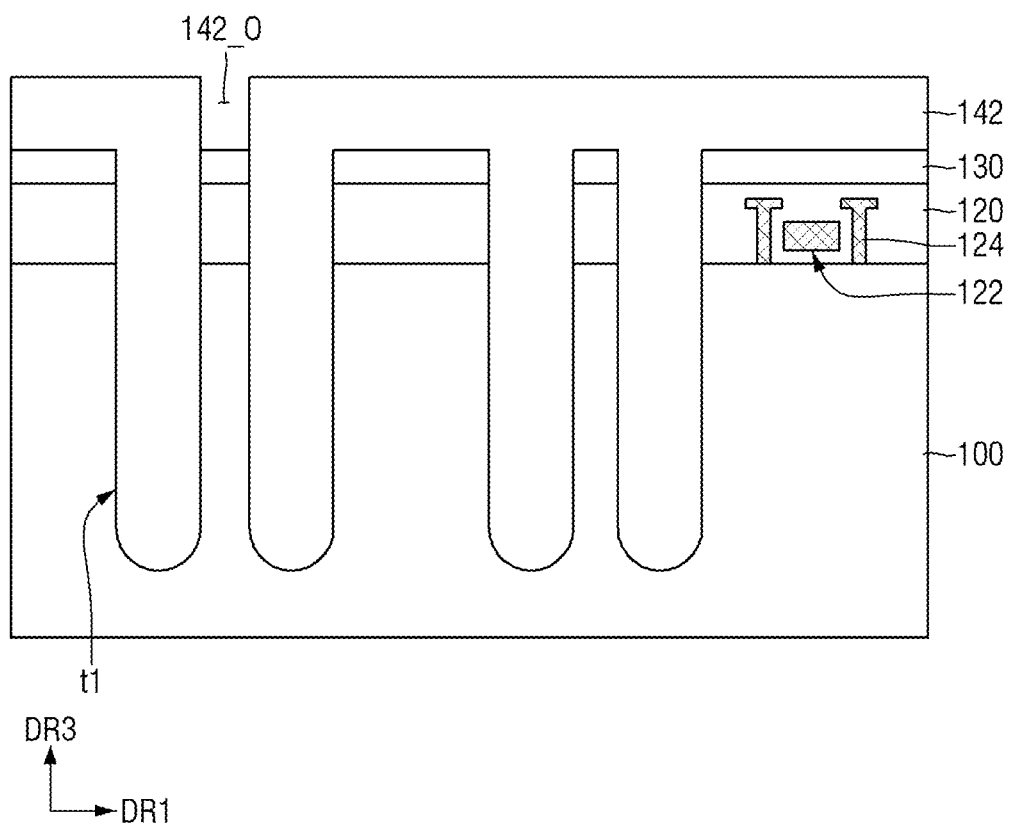

Referring to FIG. 10, a second mask pattern 142 that fills the first via hole t1 and covers the etching stop film 130 may be formed. The second mask pattern 142 may include a second opening 142_O that exposes at least a part of the upper side of the etching stop film 130. The second opening 142_O may expose the upper side of the etching stop film 130 disposed between the first via holes t1. The second opening 142_O may be formed at a position corresponding to a connecting part 12 of a through via structure (150 of FIG. 2) to be formed later. The second mask pattern 142 may be formed of, e.g., a photoresist film.

Figure 11:
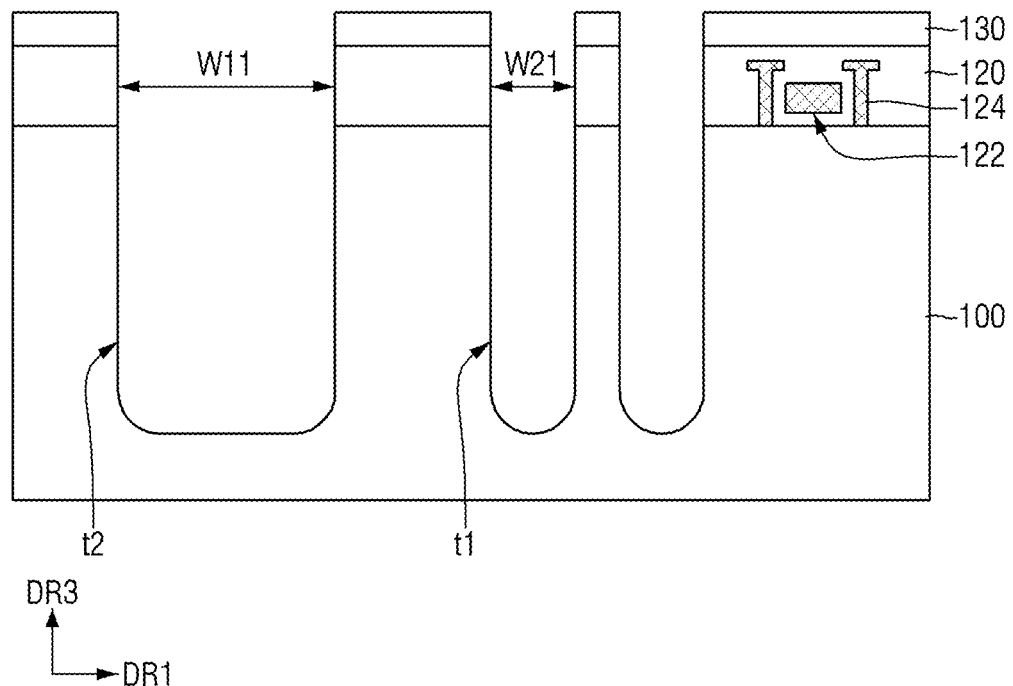

Referring to FIG. 11, the etching stop film 130, the interlayer insulating film 120, and the substrate 100 may be etched by utilizing the second mask pattern (142 of FIG. 10) as an etching mask to form a second via hole t2. In some embodiments, a bottom side of the second via hole t2 may be disposed on the same plane as a bottom side of the first via hole (t1 of FIG. 10).

Therefore, a maximum width W21 of the first via hole t1 may be smaller than a maximum width W11 of the second via hole t2 in the first direction DR1. Subsequently, the second mask pattern (142 of FIG. 10) may be removed to expose the upper side of the etching stop film 130.

Figure 12:
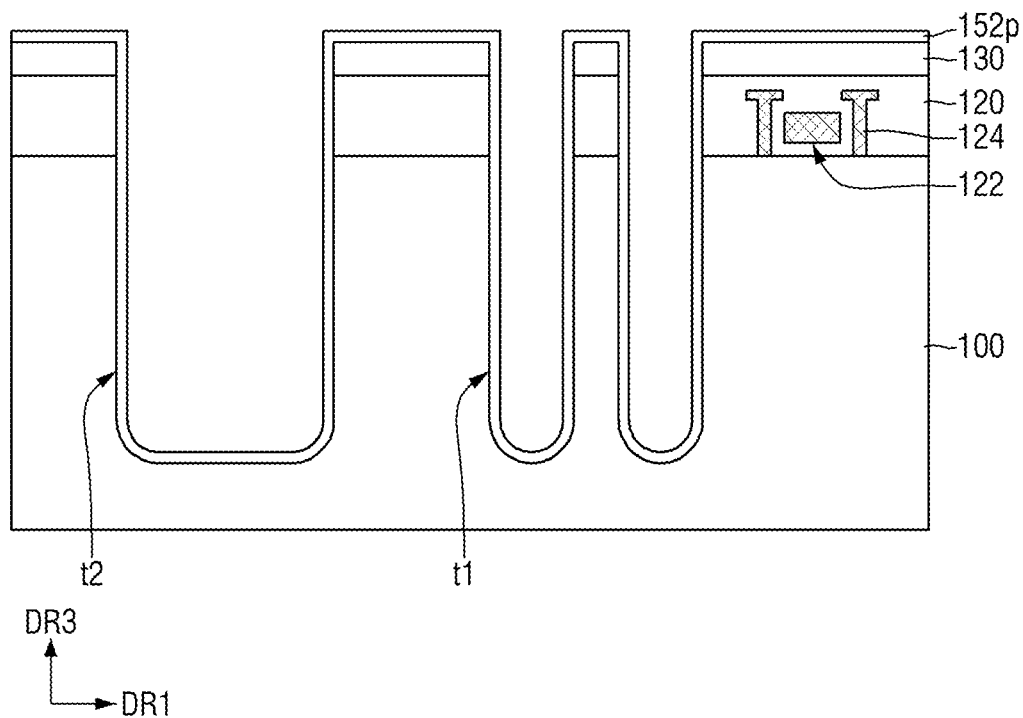

Referring to FIG. 12, a pre-via insulating film 152*p* may be formed on the upper side of the etching stop film 130 and on the first and second via holes t1 and t2. The pre-via insulating film 152*p* may extend along the side walls and the bottom sides of the first and second via holes t1 and t2. The pre-via insulating film 152*p* may be formed by, e.g., a chemical vapor deposition (CVD) process.

Figure 13:
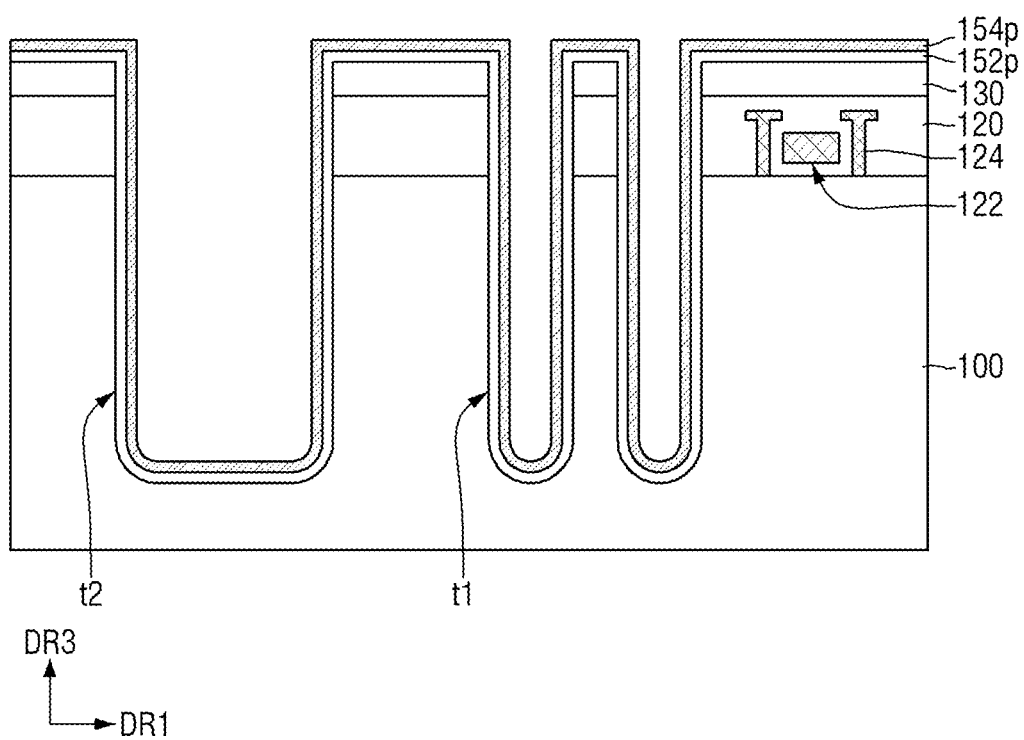

Referring to FIG. 13, a pre-barrier film 154*p* may be formed on the pre-via insulating film 152*p*. The pre-barrier film 154*p* may extend along the pre-via insulating film 152*p*. The pre-barrier film 154*p* may be formed, e.g., by a physical vapor deposition (PVD) process or a CVD process.

Figure 14:
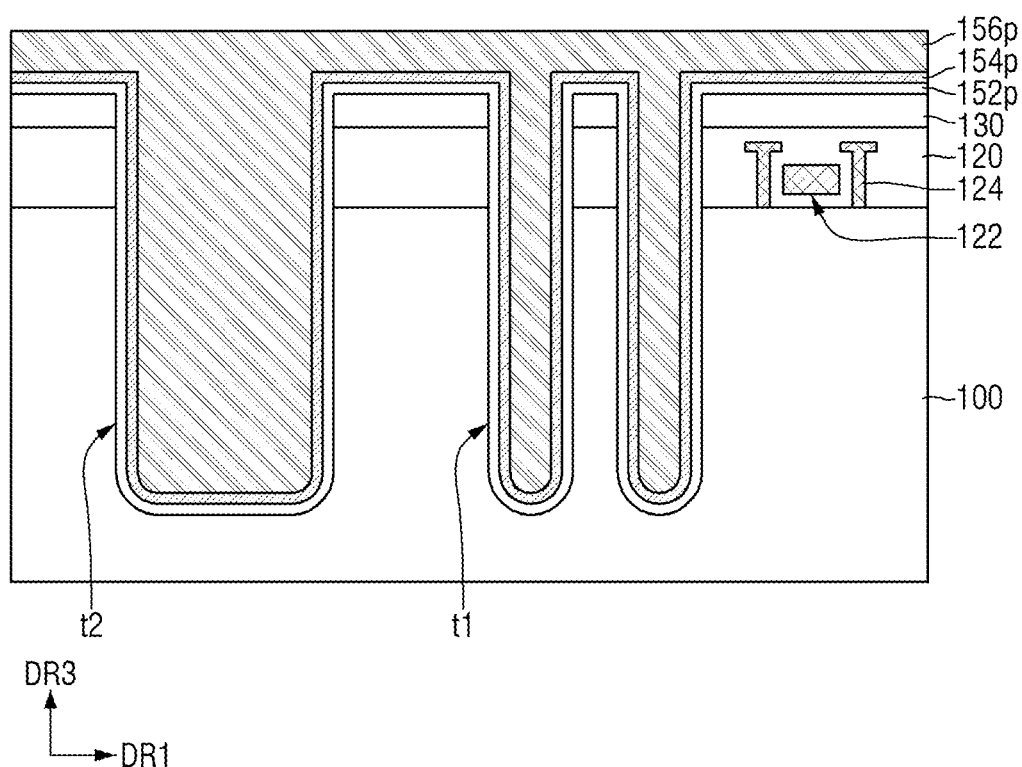

Referring to FIG. 14, a pre-core plug 156*p* may be formed on the pre-barrier film 154*p*. The pre-core plug 156*p* may fill the first and second via holes t1 and t2 and cover the pre-barrier film 154*p*.

For example, after a metal seed layer is formed on the pre-barrier film 154*p*, the pre-core plug 156*p* may be grown from the metal seed layer by an electroplating process. The seed layer may be formed of, e.g., Cu, Cu alloy, Co, Ni, Ru, Co/Cu or Ru/Cu. Although a PVD process may be used to form the seed layer, the embodiment is not limited thereto.

Figure 15:
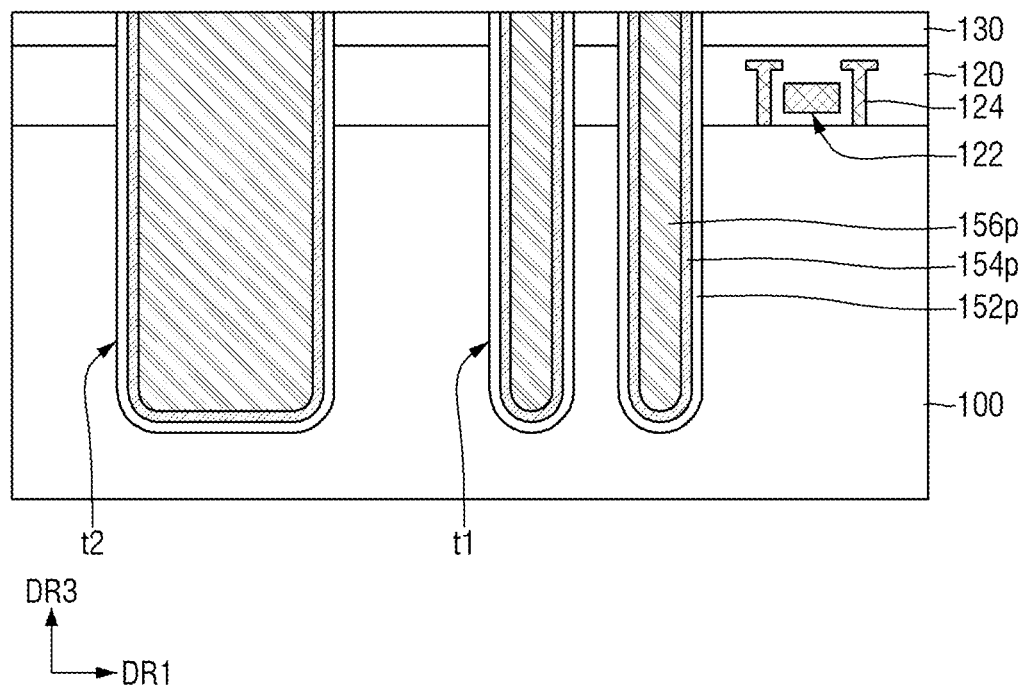
Figure 16:
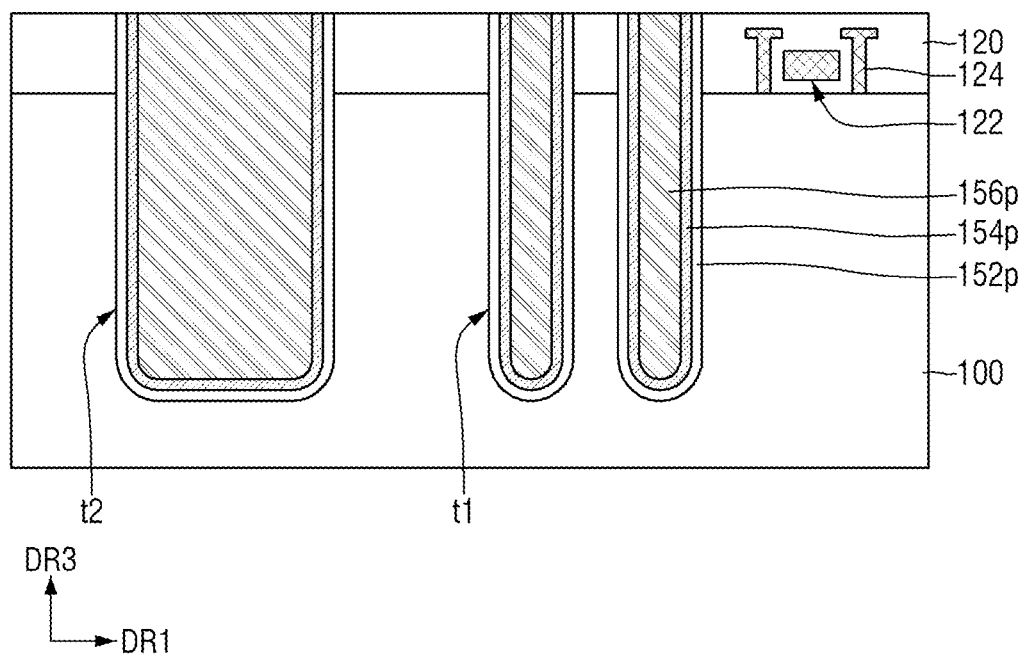

Referring to FIG. 15, a CMP (chemical mechanical polishing) process may be performed on the pre-core plug 156*p*, the pre-barrier film 154*p*, and the pre-via insulating film 152*p*, using the etching stop film 130. The etching stop film 130 may be exposed.

Therefore, the pre-core plug 156*p*, the pre-barrier film 154*p*, and the pre-via insulating film 152*p* formed on the etching stop film 130 may be removed to expose the etching stop film 130. The pre-core plug 156*p*, the pre-barrier film 154*p*, and the pre-via insulating film 152*p* may fill the first and second via holes t1 and t2.

Next, referring to FIG. 2, the wiring structure 162, and the inter-wiring insulating film 160 that surrounds the wiring structure 162 may be formed on the interlayer insulating film 120. The second passivation film 170 and the connecting terminal 180 may be formed on the inter-wiring insulating film 160. The first passivation film 110 and the first connecting pad 190 may be formed on the second side 100*b*, i.e., the lower surface, of the substrate 100. Accordingly, the through via structure 150 may be formed.

Figure 17:
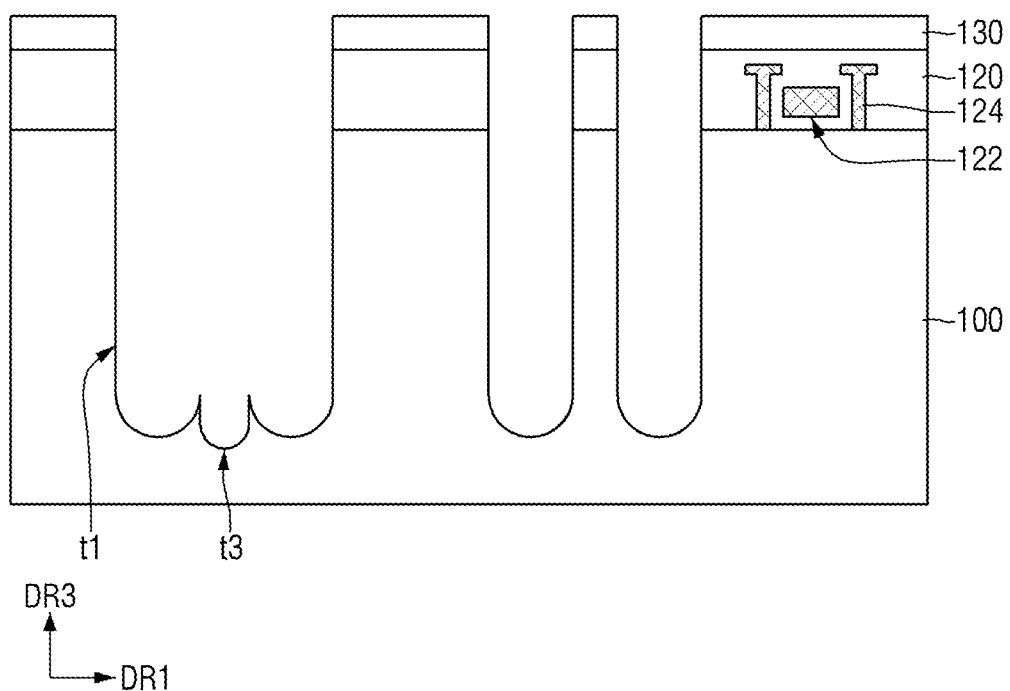
Figure 18:
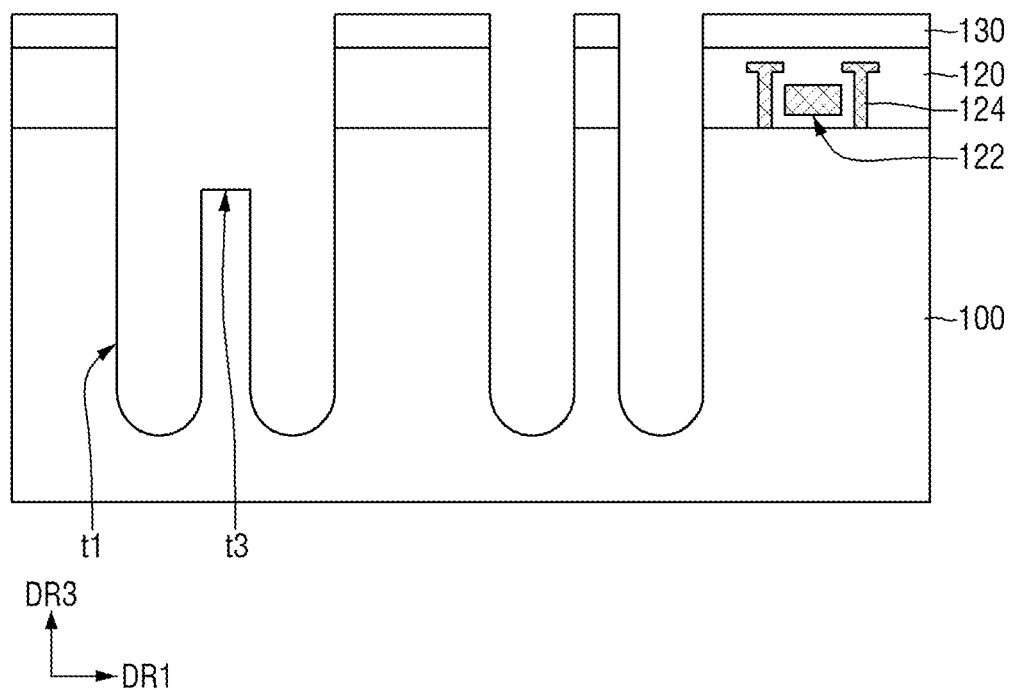
Figure 19:
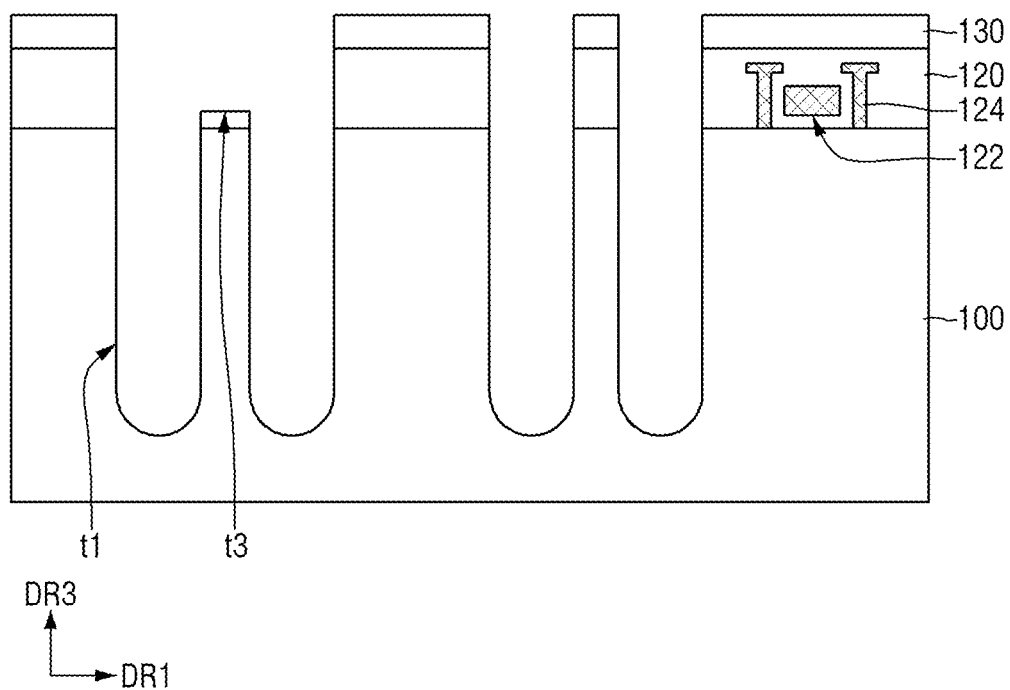

FIGS. 17 to 19 are stages in a fabricating method according to some embodiments. For convenience of explanation, only differences relative to FIGS. 8 to 16 will be mainly described. FIGS. 17 to 19 are stages after FIG. 10.

Referring to FIG. 17, the etching stop film 130, the interlayer insulating film 120, and the substrate 100 may be etched by utilizing the second mask pattern (142 of FIG. 10) as an etching mask to form a third hole t3. The third hole t3 is disposed between the first via holes t1 and may communicate with the first via holes t1. In some embodiments, a bottom side of the third hole t3 may be formed below the bottom side of the first via hole t1 inside the substrate 100. After that, the stages of FIGS. 12 to 16 may be performed.

Referring to FIG. 18, the third hole t3 is disposed between the first via holes t1 and may communicate with the first via hole t1. In some embodiments, the bottom side of the third hole t3 may be formed above the bottom side of the first via hole t1 inside the substrate 100. After that, the stages of FIGS. 12 to 16 may be performed.

Referring to FIG. 19, in some embodiments, the etching stop film 130 and the interlayer insulating film 120 may be etched by utilizing the second mask pattern (142 of FIG. 10) as an etching mask to form the third hole t3. The third hole t3 is disposed between the first via holes t1 and may communicate with the first via hole t1. In some embodiments, the bottom side of the third hole t3 may be formed above the bottom side of the first via hole t1 inside the interlayer insulating film 120. After that, the stages of FIGS. 12 to 16 may be performed.

Figure 20:
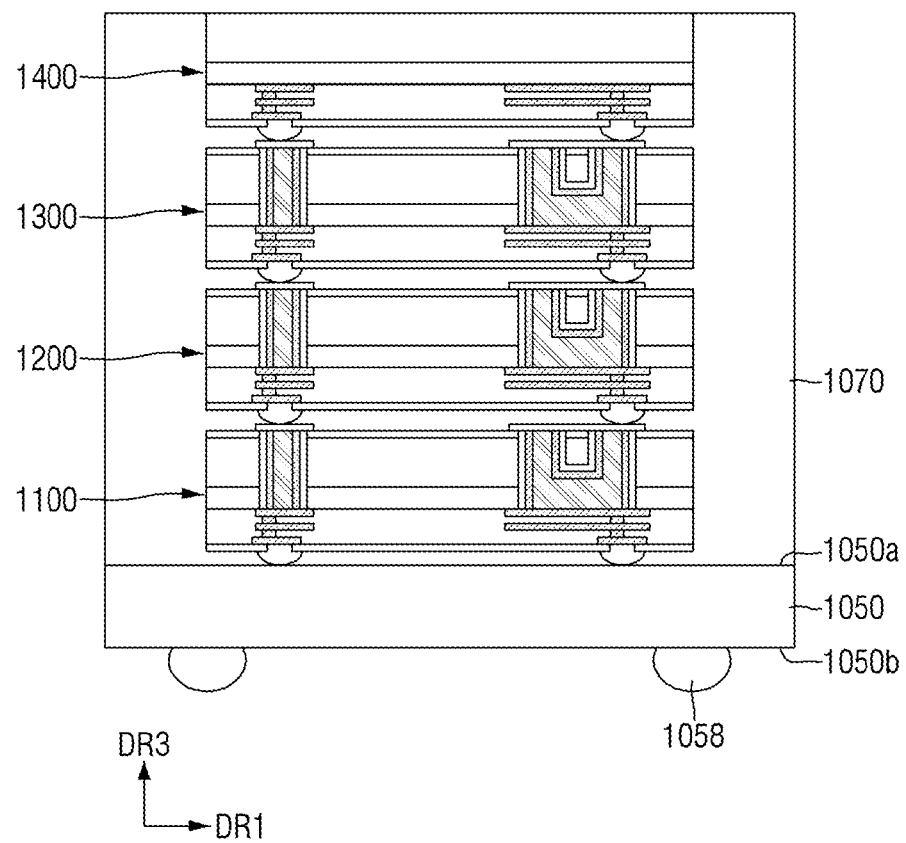
FIG. 20 is cross-sectional view of a semiconductor package including a semiconductor device according to some embodiments.

FIG. 20 is a cross-sectional view of a semiconductor package including the semiconductor device according to some embodiments.

Referring to FIG. 20, a semiconductor package according to some embodiments may include a buffer semiconductor chip 1050, a first chip connecting terminal 1058, first to fourth semiconductor chips 1100 to 1400, and a molding layer 1070.

The buffer semiconductor chip 1050 may include a first side 1050a and a second side 1050b that are opposite to each other. A through via structure according to some embodiments may also be formed inside the buffer semiconductor chip 1050.

The first to fourth semiconductor chips 1100 to 1400 may be sequentially stacked on the first side 1050a of the buffer semiconductor chip 1050. Although FIG. 20 shows that four semiconductor chips 1100 to 1400 are stacked, the embodiment is not limited thereto. The number of semiconductor chips 1100 to 1400 stacked on the buffer semiconductor chip 1050 is not limited thereto.

At least one of the first to fourth semiconductor chips 1100 to 1400 may include one of the semiconductor devices shown in FIGS. 1 to 7. The first to fourth semiconductor chips 1100 to 1400 may be electrically connected through the through via structure included in each of the first to third semiconductor chips 1100 to 1300. The fourth semiconductor chip 1400 may not have a through via structure formed inside.

The molding layer 1070 may be formed on the first side 1050a of the buffer semiconductor chip 1050. The molding layer 1070 may cover the first to fourth semiconductor chips 1100 to 1400. In some embodiments, the molding layer 1070 may expose the upper side of the fourth semiconductor chip 1400, but is not limited thereto. The molding layer 1070 may cover the upper side of the fourth semiconductor chip 1400. The molding layer 1070 may be formed of, e.g., an EMC (epoxy molding compound).

The first chip connecting terminal 1058 may be disposed on the second side 1050b of the buffer semiconductor chip 1050. The first to fourth semiconductor chips 1100 to 1400 may be connected to the outside through the buffer semiconductor chip 1050 and the first chip connecting terminal 1058. The first chip connecting terminal 1058 may be different in size, shape or structure from the connecting terminal (180 of FIGS. 2 to 6). For example, the first chip connecting terminal 1058 may be greater than the connecting terminal 180, e.g., the first chip connecting terminal 1058 may be a bump, a solder ball or a conductive filler.

Figure 21:
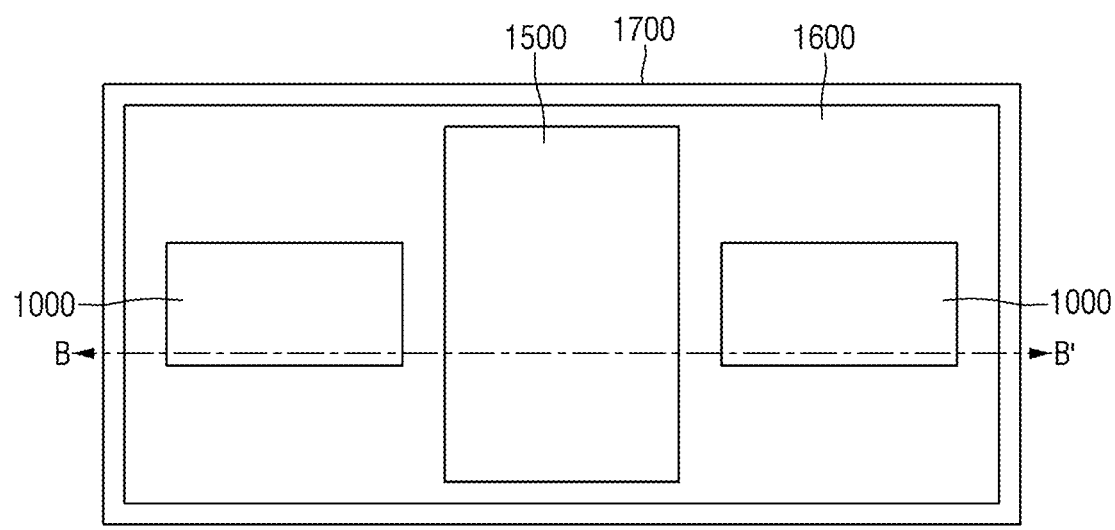
FIG. 21 is a schematic layout diagram of a semiconductor package including a semiconductor device according to some embodiments.
Figure 22:
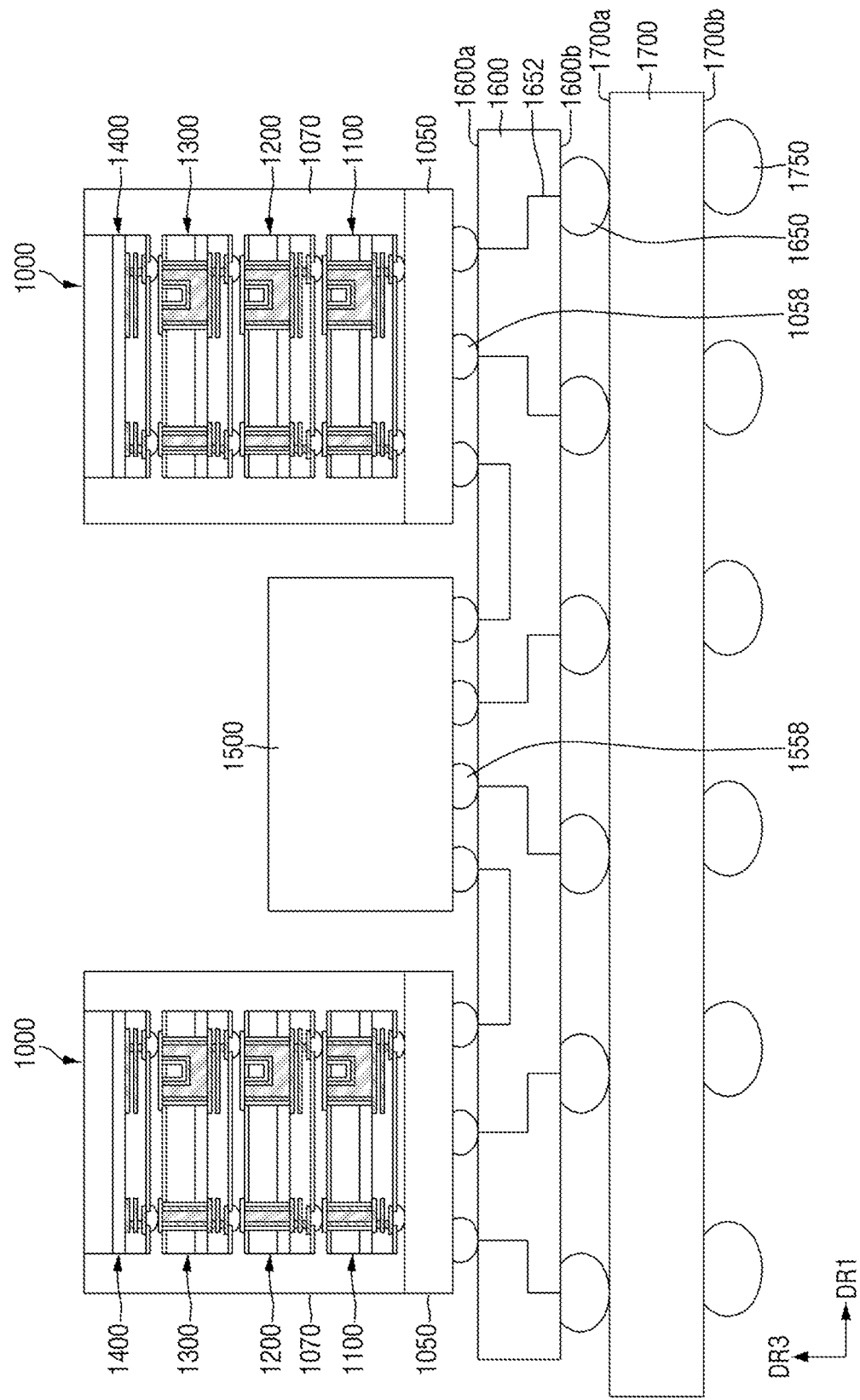
FIG. 22 is a cross-sectional view taken along line B-B' of FIG. 21.

FIG. 21 is a schematic layout diagram of a semiconductor package including a semiconductor device according to some embodiments. FIG. 22 is a cross-sectional view taken along line B-B' of FIG. 21. For convenience of explanation, only differences relative to FIG. 20 will be mainly described.

Referring to FIGS. 21 and 22, the semiconductor package according to some embodiments may include a plurality of stacked chip structures 1000, a fifth semiconductor chip 1500, a second chip connecting terminal 1558, an interposer substrate 1600, a first external connecting terminal 1650, a mounting board 1700, and a second external connecting terminal 1750. The interposer substrate 1600 may include a first side 1600a and a second side 1600b that are opposite to each other. The stacked chip structure 1000 and the fifth semiconductor chip 1500 may be disposed on the first side 1600a of the interposer substrate 1600. The stacked chip structure 1000 may be disposed apart from the fifth semiconductor chip 1500. The stacked chip structure 1000 may be disposed on both sides of the fifth semiconductor chip 1500. That is, the fifth semiconductor chip 1500 may be disposed between the stacked chip structures 1000 spaced apart from each other. Although the semiconductor package according to some embodiments may include two stacked chip structures 1000, the present disclosure is not limited thereto.

The interposer substrate 1600 may include an inter-chip connecting wiring 1652 inside. The stacked chip structure 1000 and the fifth semiconductor chip 1500 may be electrically connected to each other through the interposer substrate 1600.

The stacked chip structure 1000 may be the semiconductor package of FIG. 20. The stacked chip structure 1000 may be electrically connected to the interposer substrate 1600 through the first chip connecting terminal 1058.

The fifth semiconductor chip 1500 may be electrically connected to the interposer substrate 1600 through the second chip connecting terminal 1558. The fifth semiconductor chip 1500 may be, e.g., a semiconductor chip that performs a logic function. The fifth semiconductor chip 1500 may be, e.g., a process unit. The fifth semiconductor chip 1500 may be, e.g., a CPU (Central Processing Unit), an MPU (Micro Processor Unit) or a GPU (Graphic Processing Unit).

The mounting board 1700 may include a first side 1700a and a second side 1700b that are opposite to each other. The interposer substrate 1600 may be disposed on the first side 1700a of the mounting board 1700. The interposer substrate 1600 may be connected to the mounting board 1700 through the first external connecting terminal 1650. The second external connecting terminal 1750 may be formed on the second side 1700b of the mounting board 1700. The mounting board 1700 may be connected to the outside through the second external connecting terminal 1750. The mounting board 1700 may be a packaging board, e.g., a printed circuit board (PCB), a ceramic board, or the like.

Figure 23:
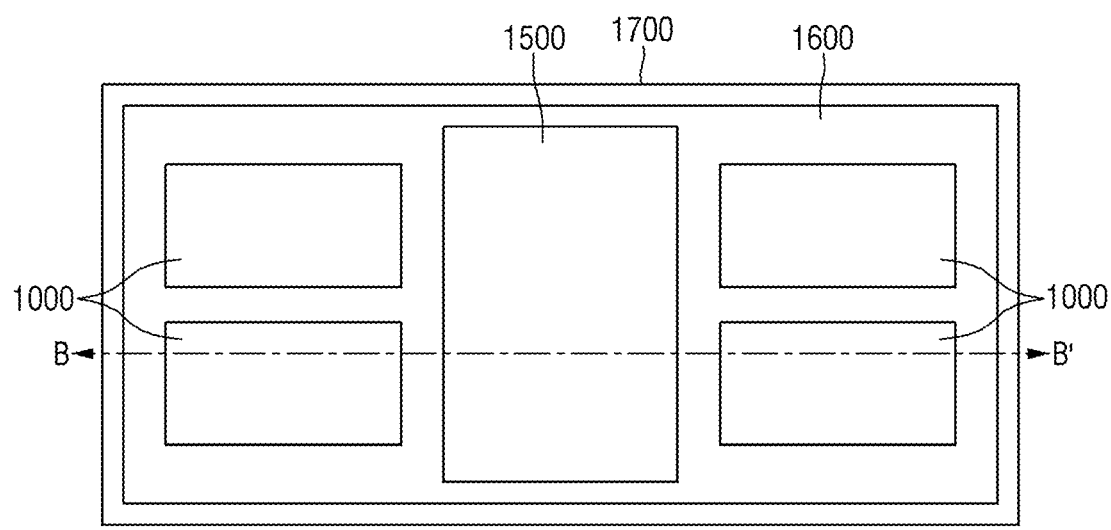
FIG. 23 is a schematic layout diagram of a semiconductor package including a semiconductor device according to some embodiments.

FIG. 23 is a schematic layout diagram of a semiconductor package including the semiconductor device according to some embodiments. For convenience of explanation, only differences relative to FIGS. 21 and 22 will be mainly described.

Referring to FIG. 23, the semiconductor package including the semiconductor device according to some embodiments may include a plurality of stacked chip structures 1000. The two stacked chip structures 1000 may each be disposed on both sides of the fifth semiconductor chip 1500. The two stacked chip structures 1000 disposed on one side of the fifth semiconductor chip 1500 may be disposed apart from each other.

Alternatively, in the semiconductor package including the semiconductor device according to some embodiments, the three stacked chip structures 1000 may each be disposed on both sides of the fifth semiconductor chip 1500. Alternatively, the semiconductor package including the semiconductor device according to some embodiments may include a plurality of fifth semiconductor chips 1500. At least one stacked chip structure 1000 may be disposed on both sides of each fifth semiconductor chip 1500.

Figure 24:
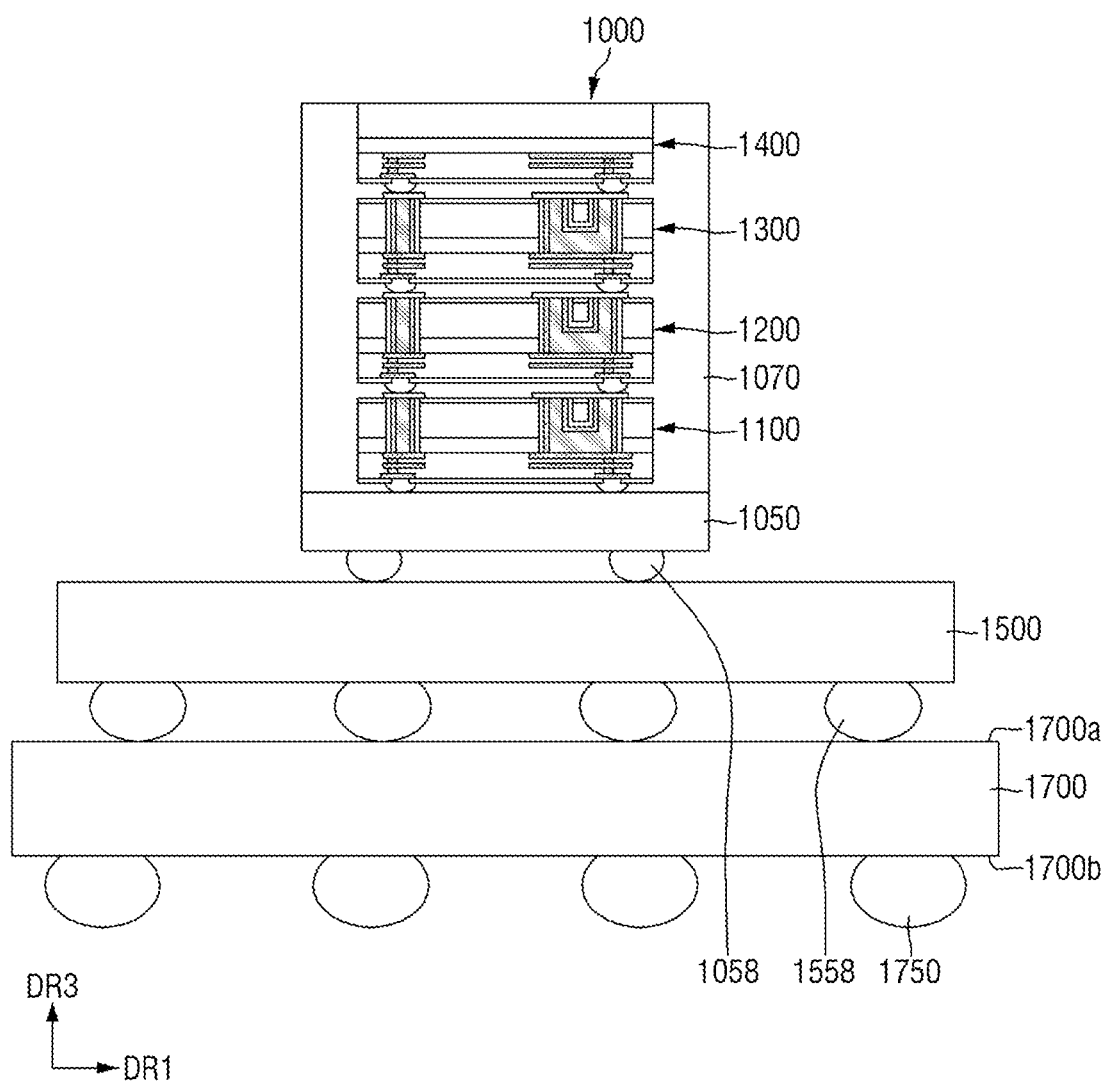
FIG. 24 is cross-sectional drawing of a semiconductor package including a semiconductor device according to some embodiments.

FIG. 24 is a cross-sectional view of a semiconductor package including the semiconductor device according to some embodiments. For convenience of explanation, only differences relative to FIGS. 21 and 22 will be mainly described.

Referring to FIG. 24, a semiconductor package including a semiconductor device according to some embodiments may include the stacked chip structure 1000, the first chip connecting terminal 1058, the fifth semiconductor chip 1500, the second chip connecting terminal 1558, and the mounting board 1700. The stacked chip structure 1000 may be disposed on the fifth semiconductor chip 1500. The stacked chip structure 1000 may be electrically connected to the fifth semiconductor chip 1500 through the first chip connecting terminal 1058.

The fifth semiconductor chip 1500 may be disposed on the mounting board 1700. The fifth semiconductor chip 1500 may be disposed on the first side 1700a of the mounting board 1700. The fifth semiconductor chip 1500 may be connected to the mounting board 1700 through the second chip connecting terminal 1558.

Figure 25:
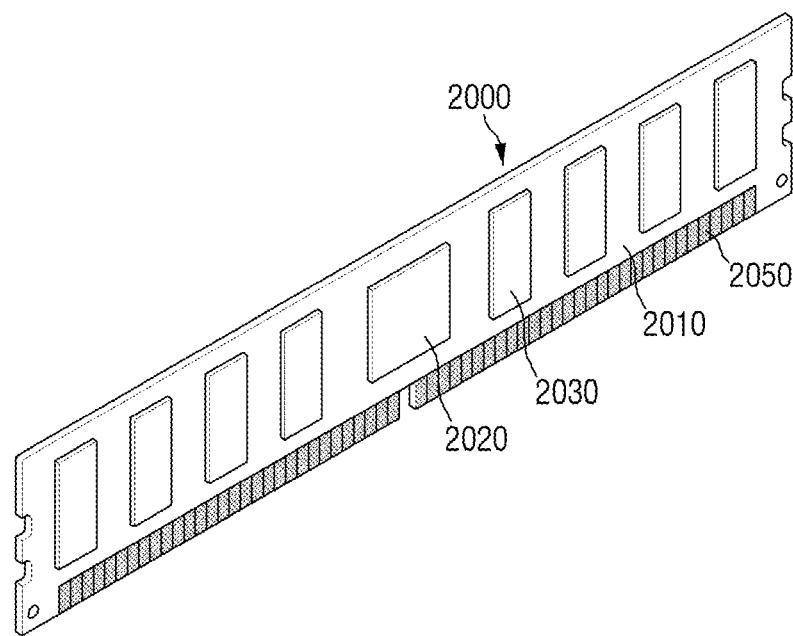
FIG. 25 is a diagram of a semiconductor module including a semiconductor device according to some embodiments.

FIG. 25 is a diagram of a semiconductor module including a semiconductor device according to some embodiments.

Referring to FIG. 25, a semiconductor module 2000 may include a module substrate 2010, a control chip 2020, and a plurality of semiconductor chips 2030. A plurality of input/output terminals 2050 that may be fitted into sockets of a motherboard are disposed on one side of the module substrate 2010. At least one of the plurality of semiconductor chips 2030 may include one of the semiconductor devices shown in FIGS. 1 to 7.

By way of summation and review, aspects of the present disclosure provide a semiconductor device having improved product reliability. That is, according to embodiments, a connecting part may be used to connect multiple penetrating parts into through via structures having different shapes and sizes in a top view, thereby enhancing design and reliability of the semiconductor device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
 a substrate including a first side and a second side opposite to each other;
 a plurality of penetrating parts penetrating the substrate and arranged in a first direction and a second direction;
 a first penetrating structure including at least two penetrating parts among the plurality of penetrating parts and a connecting part connecting the at least two penetrating parts, the connecting part penetrating a part of the substrate from the first side of the substrate; and
 a second penetrating structure including at least one penetrating part among the plurality of penetrating parts, the second penetrating structure being spaced apart from the first penetrating structure, and an area of the first penetrating structure being more than twice an area of the second penetrating structure, as viewed from the first side of the substrate,
 wherein the first direction and the second direction are parallel to the first side of the substrate, and
 wherein the second direction intersects the first direction.

2. The semiconductor device as claimed in claim 1, wherein the first penetrating structure includes:
 a first extension part which extends in the first direction, as viewed from the first side of the substrate, and
 a second extension part which extends from the first extension part in the second direction intersecting the first direction.

3. The semiconductor device as claimed in claim 2, wherein the second extension part extends in the second direction from an end of the first extension part in the first direction.

4. The semiconductor device as claimed in claim 3, wherein the first penetrating structure further includes a third extension part that extends in the first direction from an end of the second extension part, as viewed from the first side of the substrate.

5. The semiconductor device as claimed in claim 1, wherein a maximum width of the first penetrating structure in the first direction is the same as a maximum width of the first penetrating structure in the second direction intersecting the first direction, as viewed from the first side of the substrate.

6. The semiconductor device as claimed in claim 1,
 wherein a maximum width of the first penetrating structure in the first direction is different from a maximum width of the first penetrating structure in the second direction intersecting the first direction, as viewed from the first side of the substrate.

7. The semiconductor device as claimed in claim 1, wherein the first penetrating structure extends in the first direction, and the second penetrating structure extends in the second direction different from the first direction, as viewed from the first side of the substrate.

8. The semiconductor device as claimed in claim 7, wherein the second direction is a direction between the first direction and a third direction orthogonal to the first direction.

9. The semiconductor device as claimed in claim 1, further comprising:
 an interlayer insulating film on the first side of the substrate, the interlayer insulating film including a semiconductor element, wherein each of the first penetrating structure and the second penetrating structure penetrate the interlayer insulating film.

10. A semiconductor device, comprising:
a substrate including a first side and a second side opposite to each other;
a plurality of penetrating parts penetrating the substrate and arranged in a first direction and a second direction;
a first through via structure having a first penetrating part and a second penetrating part among the plurality of penetrating parts, the second penetrating part being spaced apart from the first penetrating part in the first direction, and a connecting part which penetrates a part of the substrate from the first side of the substrate and connects the first penetrating part and the second penetrating part; and
an interlayer insulating film on the first side of the substrate, the interlayer insulating film including a semiconductor element,
wherein the first direction and the second direction are parallel to the first side of the substrate, and
wherein the second direction intersects the first direction.

11. The semiconductor device as claimed in claim 10, wherein the first penetrating part includes:
a first extension part which extends in the first direction, as viewed from the first side of the substrate, and
a second extension part which extends from the first extension part in the second direction intersecting the first direction.

12. The semiconductor device as claimed in claim 11, wherein the second extension part extends in the second direction from an end of the first extension part in the first direction.

13. The semiconductor device as claimed in claim 11, wherein the first penetrating part further includes a third extension part that extends in the first direction from an end of the second extension part, as viewed from the first side of the substrate.

14. The semiconductor device as claimed in claim 10, wherein a maximum width of the first penetrating part in the first direction is the same as a maximum width of the first penetrating part in the second direction intersecting the first direction, as viewed from the first side of the substrate.

15. The semiconductor device as claimed in claim 10, wherein a maximum width of the first penetrating part in the first direction is different from a maximum width of the first penetrating part in the second direction intersecting the first direction, as viewed from the first side of the substrate.

16. The semiconductor device as claimed in claim 10, further comprising:
a wiring structure on the interlayer insulating film; and
a connecting terminal electrically connected to the wiring structure.

17. The semiconductor device as claimed in claim 16, further comprising:
an upper wiring between the connecting terminal and the wiring structure,
wherein the wiring structure includes an inter-wiring insulating layer, and a wiring layer electrically connected to the upper wiring inside the inter-wiring insulating layer.

18. A semiconductor device, comprising:
a substrate including a first side and a second side opposite to each other;
a plurality of penetrating parts penetrating the substrate and arranged in a first direction and a second direction;
a first through via structure which includes at least two penetrating parts among the plurality of penetrating parts and a connecting part connecting the at least two penetrating parts, and has a first maximum width in the first direction, the connecting part penetrating a part of the substrate from the first side of the substrate; and
a second through via structure which includes at least one penetrating part among the plurality of penetrating parts and has a second maximum width in the first direction, the second through via structure being spaced apart from the first through via structure, and the second maximum width being less than the first maximum width,
wherein the first direction and the second direction are parallel to the first side of the substrate, and
wherein the second direction intersects the first direction.

19. The semiconductor device as claimed in claim 18, wherein each of the at least two penetrating parts includes:
a single core plug that penetrates the substrate,
a barrier film that surrounds the single core plug, and
a via insulating film between the barrier film and the substrate.

* * * * *